US012677417B2

(12) United States Patent
Yang et al.

(10) Patent No.: US 12,677,417 B2
(45) Date of Patent: Jul. 7, 2026

(54) THREE DIMENSIONAL (3D) MEMORY DEVICE AND FABRICATION METHOD

(71) Applicant: Yangtze Memory Technologies Co., Ltd., Wuhan (CN)

(72) Inventors: Yi Yang, Wuhan (CN); Tingting Gao, Wuhan (CN); Xiaoxin Liu, Wuhan (CN); Wei Yuan, Wuhan (CN); Xiaolong Du, Wuhan (CN); Changzhi Sun, Wuhan (CN); Zhihao Song, Wuhan (CN); Shan Li, Wuhan (CN); Zhiliang Xia, Wuhan (CN); Zongliang Huo, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 667 days.

(21) Appl. No.: 18/090,049

(22) Filed: Dec. 28, 2022

(65) Prior Publication Data

US 2024/0215237 A1 Jun. 27, 2024

(30) Foreign Application Priority Data

Dec. 21, 2022 (CN) .......................... 202211651307.9

(51) Int. Cl.
| | |
|---|---|
| *H10B 43/27* | (2023.01) |
| *H10B 41/27* | (2023.01) |
| *H10B 80/00* | (2023.01) |

(52) U.S. Cl.
CPC ............. *H10B 43/27* (2023.02); *H10B 41/27* (2023.02); *H10B 80/00* (2023.02)

(58) Field of Classification Search
None
See application file for complete search history.

(56) References Cited

U.S. PATENT DOCUMENTS

| | | | | |
|---|---|---|---|---|
| 2017/0352552 A1* | 12/2017 | Lee | ..................... | H01L 21/3085 |
| 2020/0035699 A1* | 1/2020 | Liu | ........................ | H10B 43/35 |
| 2024/0206167 A1* | 6/2024 | Zhang | .................... | H10B 41/27 |
| 2024/0215231 A1* | 6/2024 | Liu | ........................ | H10B 43/50 |
| 2024/0215236 A1* | 6/2024 | Li | .......................... | H10B 43/27 |
| 2024/0215238 A1* | 6/2024 | Li | .......................... | H10B 43/27 |

* cited by examiner

*Primary Examiner* — Sarah K Salerno
(74) *Attorney, Agent, or Firm* — Anova Law Group, PLLC

(57) ABSTRACT

A method for fabricating a 3D memory device includes forming a sacrificial layer over a substrate, forming a first dielectric stack over the sacrificial layer, forming a channel hole structure, forming an opening that exposes the sacrificial layer, removing the sacrificial layer to create a cavity and expose a part of the channel hole structure, forming a semiconductor layer to fill the cavity, filling the opening with a filling structure, and forming a second dielectric stack over the filling structure. The opening is made for a gate line slit (GLS) structure.

20 Claims, 21 Drawing Sheets

—113
—112
—111
—110

—114
—113
—112
—111
—110

180

190

200

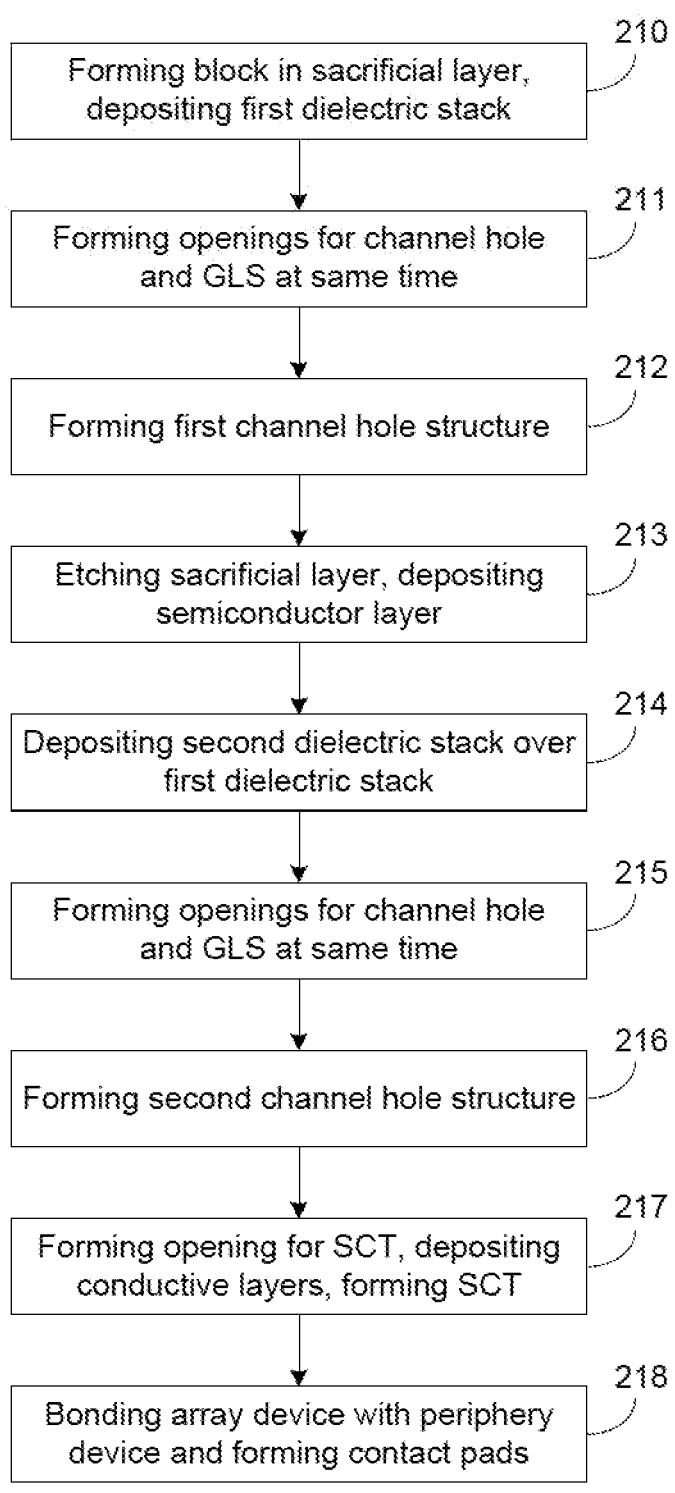

210 Forming block in sacrificial layer, depositing first dielectric stack

211 Forming openings for channel hole and GLS at same time

212 Forming first channel hole structure

213 Etching sacrificial layer, depositing semiconductor layer

214 Depositing second dielectric stack over first dielectric stack

215 Forming openings for channel hole and GLS at same time

216 Forming second channel hole structure

217 Forming opening for SCT, depositing conductive layers, forming SCT

218 Bonding array device with periphery device and forming contact pads

THREE DIMENSIONAL (3D) MEMORY DEVICE AND FABRICATION METHOD

CROSS-REFERENCE TO RELATED APPLICATION

This application claims the priority of Chinese Patent Application No. 202211651307.9, filed on Dec. 21, 2022, the content of which is incorporated herein by reference in its entirety.

FIELD OF THE TECHNOLOGY

This application relates to the field of semiconductor technology and, specifically, to a three-dimensional (3D) memory device and fabrication method thereof.

BACKGROUND OF THE DISCLOSURE

Not-AND (NAND) memory is a non-volatile type of memory that does not require power to retain stored data. The growing demands of consumer electronics, cloud computing, and big data bring about a constant need of NAND memories of larger capacity and better performance. As conventional two-dimensional (2D) NAND memory approaches its physical limits, three-dimensional (3D) NAND memory is now playing an important role. 3D NAND memory uses multiple stack layers on a single die to achieve higher density, higher capacity, faster performance, lower power consumption, and better cost efficiency.

In some cases, a 3D NAND memory device contains multiple stacks or decks that are formed sequentially based on a substrate along a vertical direction. Each deck contains layers of memory cells. During the fabrication process, channel hole structures and gate line slit (GLS) structures are made separately, and the multiple stacks may have instability risks. The disclosed memory structures and methods may improve certain aspects of the fabrication process.

SUMMARY

In one aspect of the present disclosure, a method for fabricating a 3D memory device includes forming a sacrificial layer over a substrate, forming a first dielectric stack over the sacrificial layer, forming a first channel hole structure extending through the first dielectric stack and sacrificial layer, forming a first opening that extends through the first dielectric stack for a GLS structure and exposes the sacrificial layer, removing the sacrificial layer by etch to create a cavity and expose a part of the first channel hole structure in the cavity, forming a semiconductor layer to fill the cavity, filling the first opening with a filling structure after forming the semiconductor layer, and forming a second dielectric stack over the filling structure. The first dielectric stack includes a first dielectric layer and a second dielectric layer alternately stacked. The second dielectric stack includes a third dielectric layer and a fourth dielectric layer alternately stacked.

In another aspect of the present disclosure, a 3D memory device includes a first conductor/insulator stack having a first conductive layer and a first dielectric layer alternatingly stacked, a second conductor/insulator stack formed over and aligned with the first conductor/insulator stack and having a second conductive layer and a second dielectric layer alternatingly stacked, a channel hole structure extending through the first and second conductor/insulator stacks along a first direction, and a GLS structure. The GLS structure includes a first taper part through the first conductor/insulator stack and a second taper part through the second conductor/insulator stack along the first direction.

In another aspect of the present disclosure, a system includes a memory device, and a memory controller for controlling the memory device. The memory device includes a first conductor/insulator stack containing a first conductive layer and a first dielectric layer alternatingly stacked, a second conductor/insulator stack formed over and aligned with the first conductor/insulator stack and having a second conductive layer and a second dielectric layer alternatingly stacked, a channel hole structure extending through the first and second conductor/insulator stacks along a first direction, and a GLS structure. The GLS structure includes a first taper part through the first conductor/insulator stack and a second taper part through the second conductor/insulator stack along the first direction.

Other aspects of the present disclosure can be understood by those skilled in the art in light of the description, the claims, and the drawings of the present disclosure.

BRIEF DESCRIPTION OF THE DRAWINGS

FIG. 36 illustrates a schematic flow chart of fabrication of a 3D memory device according to various aspects of the present disclosure;

DETAILED DESCRIPTION

The following describes the technical solutions according to various aspects of the present disclosure with reference to the accompanying drawings. Wherever possible, the same reference numbers will be used throughout the drawings to refer to the same or like parts. Apparently, the described aspects are merely some but not all of the aspects of the present disclosure. Features in various aspects may be exchanged and/or combined.

FIGS. 1-33 schematically show a fabrication process of an exemplary 3D array device 100 according to aspects of the present disclosure. The 3D array device 100 is a part of a memory device and may also be referred to as a 3D memory structure. Among the figures, top views are in an X-Y plane and cross-sectional views are taken along a line in the X-Y plane.

Figures 1, 2:
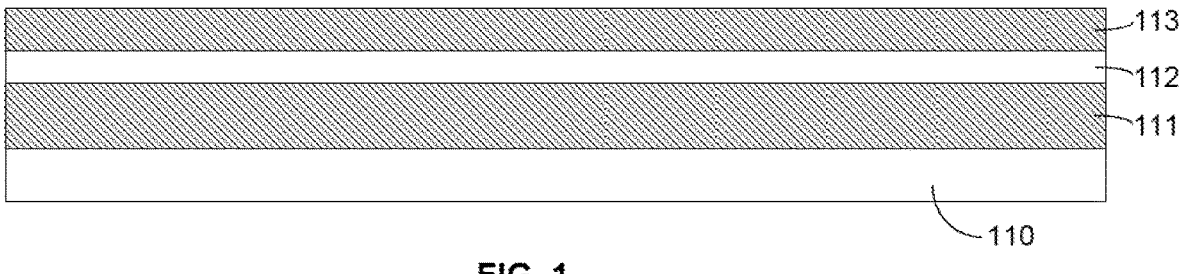
FIG. 1 illustrates a cross-sectional view of a structure of an exemplary three-dimensional (3D) array device at a certain stage during a fabrication process according to various aspects of the present disclosure.
FIGS. 2 and 3 illustrate a cross-sectional view and a top view of the 3D array device shown in FIG. 1 at a certain stage according to various aspects of the present disclosure.

As shown in FIG. 1, a structure of the 3D array device 100 includes a substrate 110. In some aspects, the substrate 110 may include a single crystalline silicon layer. The substrate 110 may also include a semiconductor material, such as germanium (Ge), silicon-germanium (SiGe), silicon carbide (SiC), silicon-on-insulator (SOI), germanium-on-insulator (GOI), polysilicon, or a Group III-V compound such as gallium arsenide (GaAs) or indium phosphide (InP). Optionally, the substrate 110 may also include an electrically non-conductive material such as glass, a plastic material, or a ceramic material. When the substrate 110 includes glass, plastic, or ceramic material, the substrate 110 may further include a thin layer of polysilicon deposited on the glass, plastic, or ceramic material. In this case, the substrate 110 may be processed like a polysilicon substrate. As an example, the substrate 110 includes an undoped or lightly doped single crystalline silicon layer in descriptions below.

Figure 3:
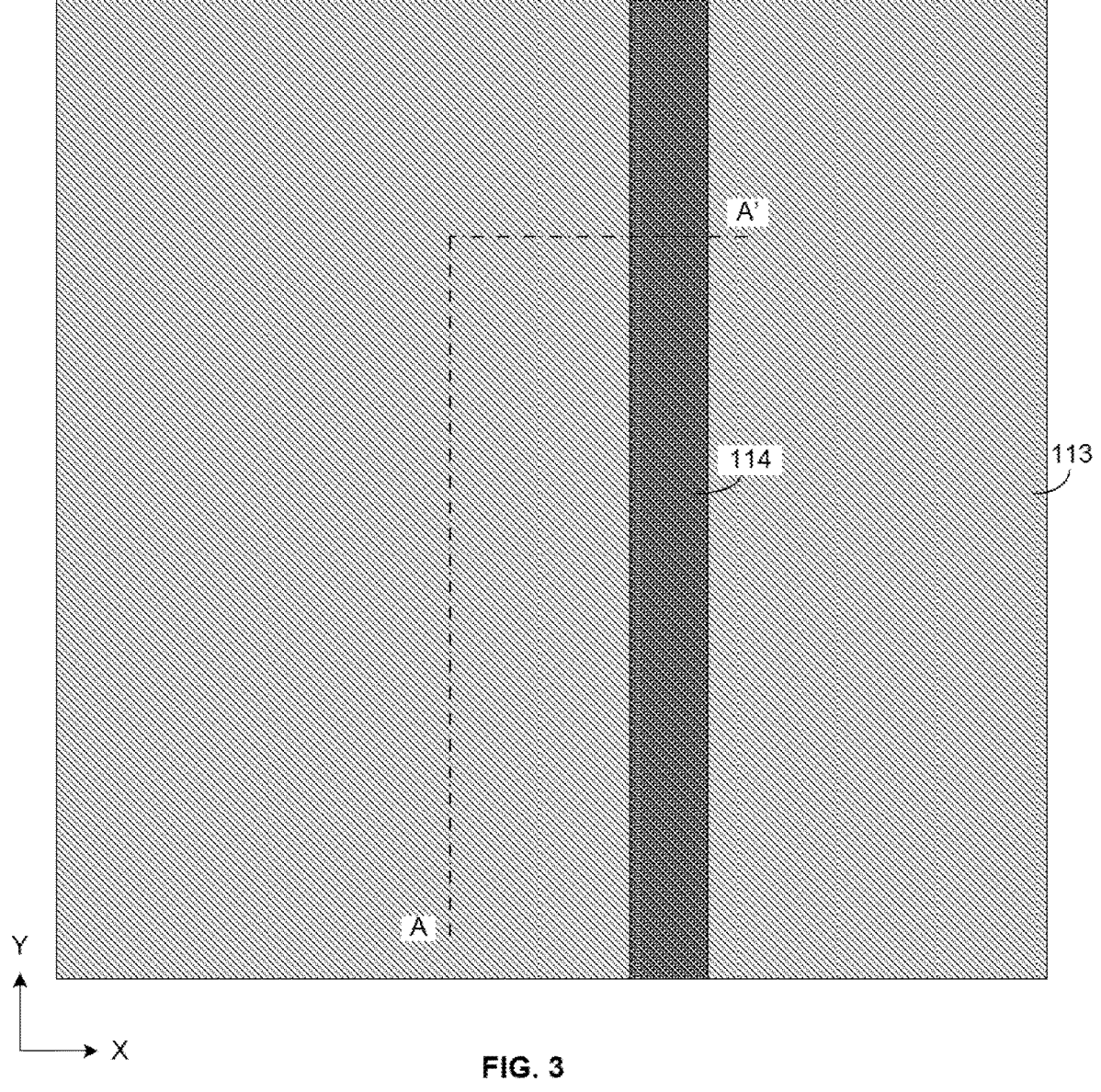

In some aspects, layers 111-113 are deposited over substrate 110, as shown in FIG. 1. The deposition may be performed by chemical vapor deposition (CVD), physical vapor deposition (PVD), atomic layer deposition (ALD), or a combination thereof. The layers 111 and 113 are exemplarily undoped or lightly doped polysilicon layers, and the layer 112 is exemplarily a silicon oxide layer. In some other cases, the layer 111 represents a part of the substrate 110. In these cases, there is no boundary between the layer 111 and substrate 110. Optionally, the layer 113 is a sacrificial layer. Further, a portion of the layer 113 is removed by a selective etch process, such as a selective a dry etch process or a combination of selective dry and wet etch processes. The etch creates an opening (not shown) that exposes the layer 112 at the bottom. The opening is subsequently filled by a carbon material to form a carbon block 114, as shown in FIGS. 2 and 3. The carbon block 114 may be referred to as a block region. In some other aspects, the block 114 may be made from another material other than carbon. The cross-sectional view shown in FIG. 2 is taken along a line AA' of FIG. 3. The filling process may be done by CVD or ALD.

Figure 4:
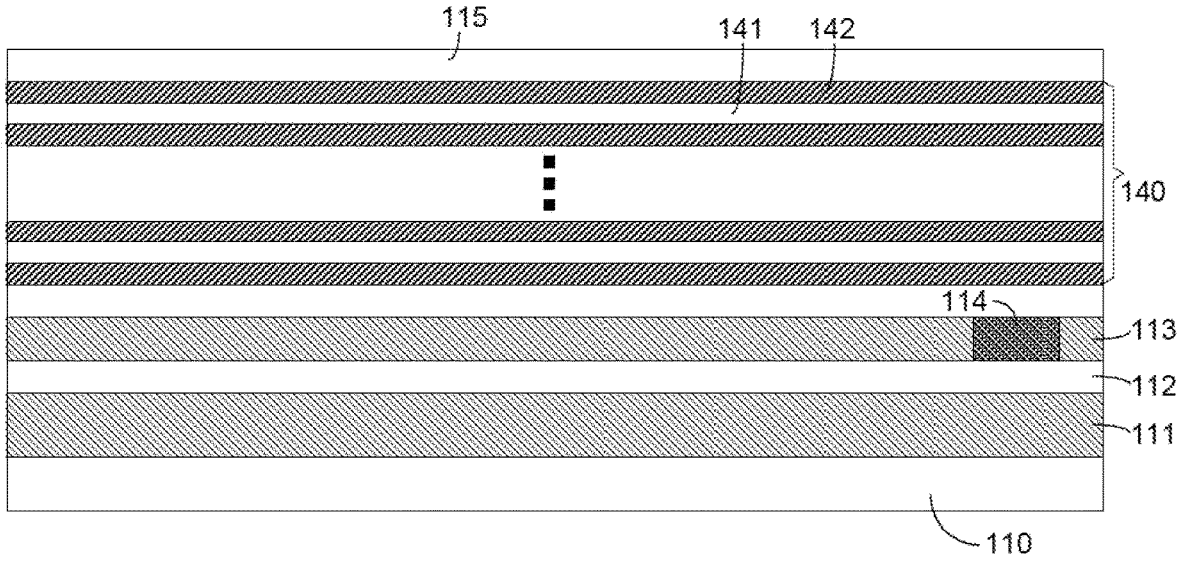
FIG. 4 illustrates a cross-sectional view of the 3D array device shown in FIGS. 2 and 3 after a dielectric stack structure is made according to various aspects of the present disclosure.

Further, a dielectric stack 140 is formed over the substrate 110, layers 111-113, and carbon block 114. A dielectric layer 115 is formed over the dielectric stack 140, as depicted in FIG. 4. The carbon block 114 is sandwiched between the dielectric stack 140 and the substrate 110 or the layers 111-112 in the Z direction or a direction perpendicular to the substrate 110. The layer 115 may include silicon oxide. The dielectric stack 140 may be considered as a dielectric stack structure that includes multiple pairs of stack layers, for example, including first dielectric layers 141 and second dielectric layers 142, stacked alternately over each other. Some layers of the dielectric stack 140 are used to form memory cells. In some cases, the layers for fabricating memory cells may include 64 pairs, 128 pairs, or more than 128 pairs of the first and second dielectric layers 141 and 142.

In some aspects, the first dielectric layers 141 and the second dielectric layers 142 are made of different materials. In descriptions below, the first dielectric layer 141 includes a silicon oxide layer exemplarily, which may be used as an isolation stack layer, while the second dielectric layer 142 includes a silicon nitride layer exemplarily, which may be used as a sacrificial stack layer. The sacrificial stack layer will be subsequently etched out and replaced by a conductive stack layer. The first dielectric layers 141 and second dielectric layers 142 may be deposited via CVD, PVD, ALD, or a combination thereof.

Figure 5:
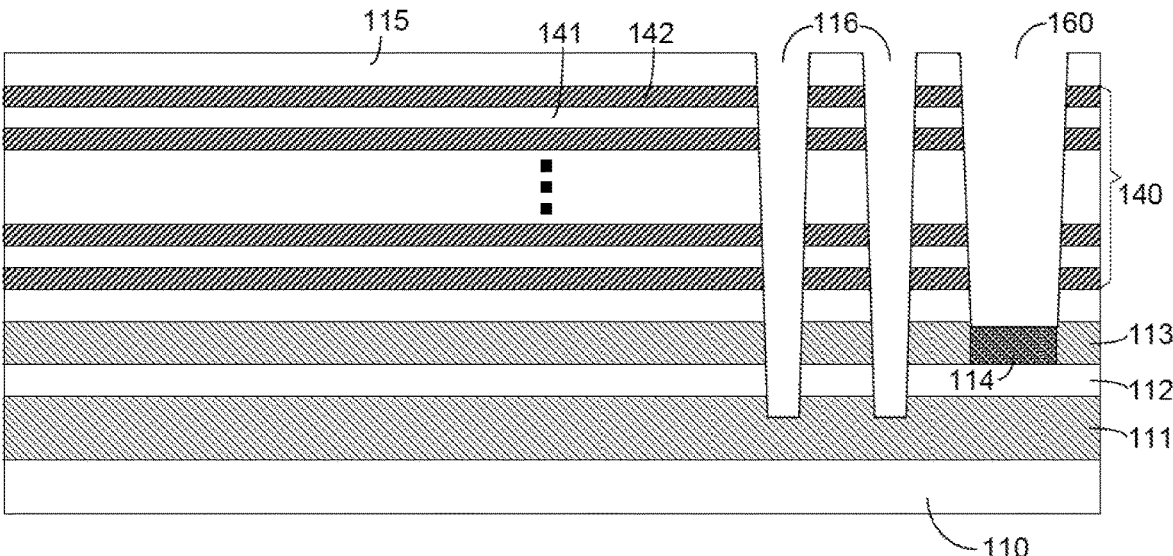
FIGS. 5 and 6 illustrate a cross-sectional view and a top view of the 3D array device shown in FIG. 4 after certain openings are formed according to various aspects of the present disclosure.
Figure 6:
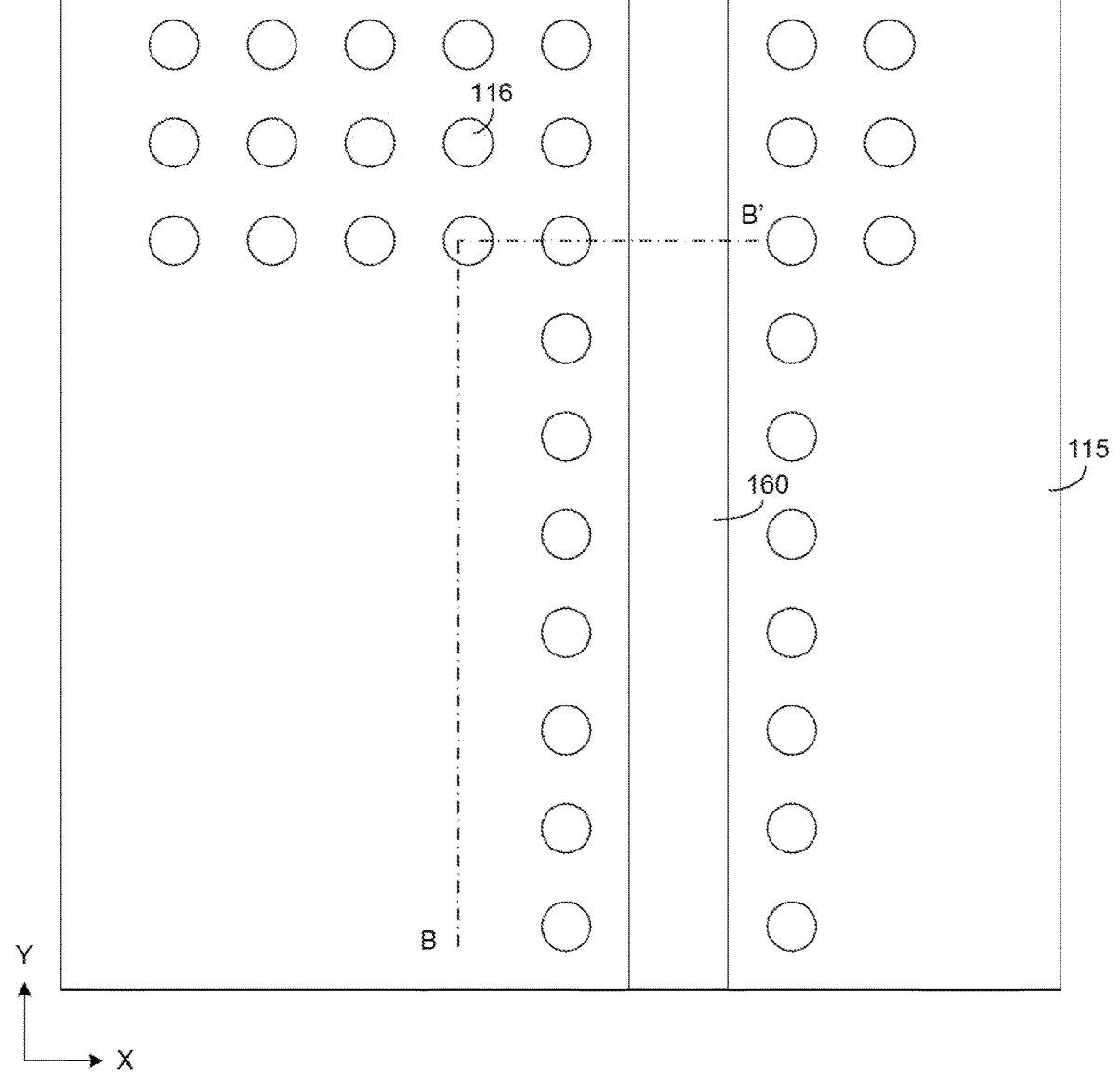

FIGS. 5 and 6 show a schematic cross-sectional view and a schematic top view of the structure of the 3D array device 100 after openings 116 and 160 are etched according to aspects of the present disclosure. The cross-sectional view shown in FIG. 5 is taken along a line BB' of FIG. 6. The opening 116 may be referred to as a channel hole and is made for forming a channel hole structure, while the opening 160 is made for a gate line slit (GLS). The GLS may also be referred to as a GLS structure. The channel holes and opening 160 may be formed at the same time by, for example, a selective dry etch process or a combination of selective dry and selective wet etch processes. In some cases, one mask or one mask set may be used for the etch. Optionally, the channel holes and opening 160 may be made separately at different time periods with the same process or similar processes. The selective etch process is arranged such that the etch rate of the polysilicon layers 111 and 113 and silicon oxide layer 112 is much faster than the etch rate of the carbon block 114. Consequently, the channel holes are etched such that they extend deeper than the opening 160 in the Z direction or a direction approximately perpendicular to the substrate 110.

The channel holes may have a cylinder shape or pillar shape that extends through the dielectric stack 140, the layers 112-113, and partially penetrates the layer 111. A portion of the layer 111 is exposed at the bottom of the channel hole. The opening 160 is aligned to the carbon block 114 along the Z direction or the vertical direction, and extends in the Y direction in the X-Y plane. The opening 160 passes through the dielectric stack 140 and reaches or partially penetrates the carbon block 114, because of the slower etch rate of the block 114. In some aspects, the openings 116 and 160 have a taper angle. The horizontal dimension of the openings 116 decreases gradually from the top to the bottom. The width of the opening 160, i.e., the horizontal dimension of the opening 160 in the X direction, also decreases gradually from the top to the bottom. The taper parts of the openings 116 and 160 pass through dielectric stack 140. The carbon block 114 is exposed at the bottom of the opening 160. The quantity, dimension, shape, and arrangement of the channel holes and opening 160 shown in FIGS. 5 and 6 are exemplary and for description purposes, although any suitable quantity, dimension, and arrangement may be used for the disclosed 3D array device 100 according to various aspects of the present disclosure.

As illustrated above, since both the channel hole and GLS structures extend through the dielectric stack 140, the channel holes and the opening for GLS (i.e., the opening 160) may be formed at the same time by the same process with one mask or one mask set. Compared to etching the channel holes and the opening for GLS separately in two processes with multiple masks or multiple mask sets, the fabrication cost may be reduced in some cases.

Figure 7:
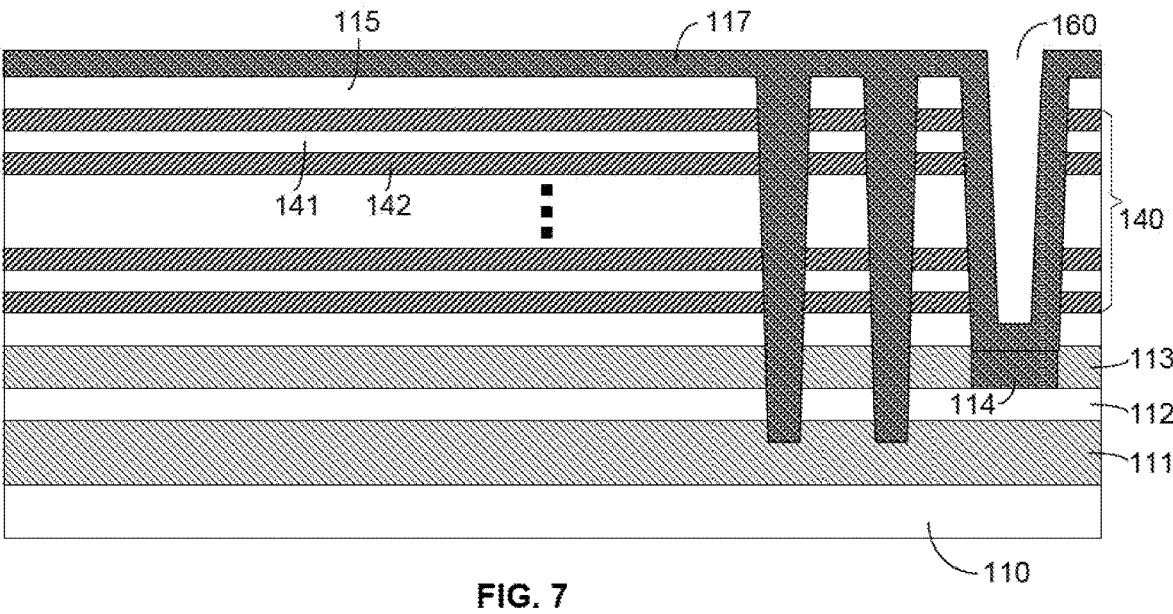
FIGS. 7-10 illustrate cross-sectional views of the 3D array device shown in FIGS. 5 and 6 at certain stages during the fabrication process according to various aspects of the present disclosure.
Figure 8:
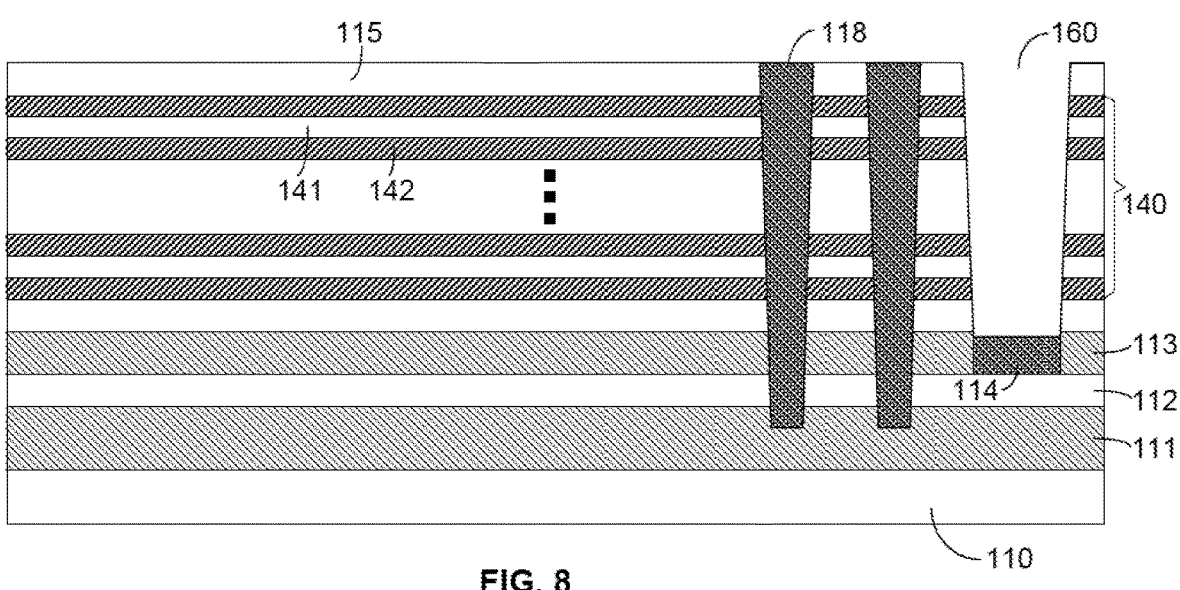

Further, a carbon material is deposited over the top surface of the structure of the 3D array device 100 to form a layer 117 via CVD and/or ALD. As shown in FIG. 7, the layer 117 fills the channel holes (i.e., openings 116). The layer 117 also covers the sidewall and exposed surface of the carbon block 114 at the bottom of the opening 160. After a timed selective etch, e.g., a selective wet etch, certain exposed portions of the layer 117 are etched away, while the carbon material deposited inside the channel holes remains there. As shown in FIG. 8, the channel holes are filled with a filling structure 118 and the carbon block 114 is exposed again.

Figure 9:
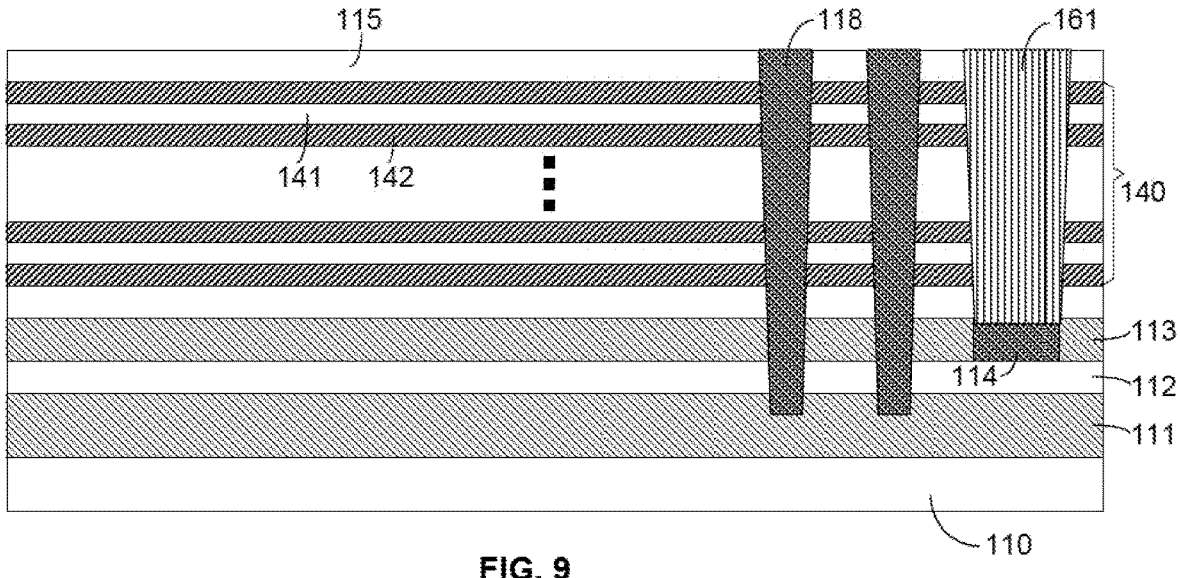
Figure 10:
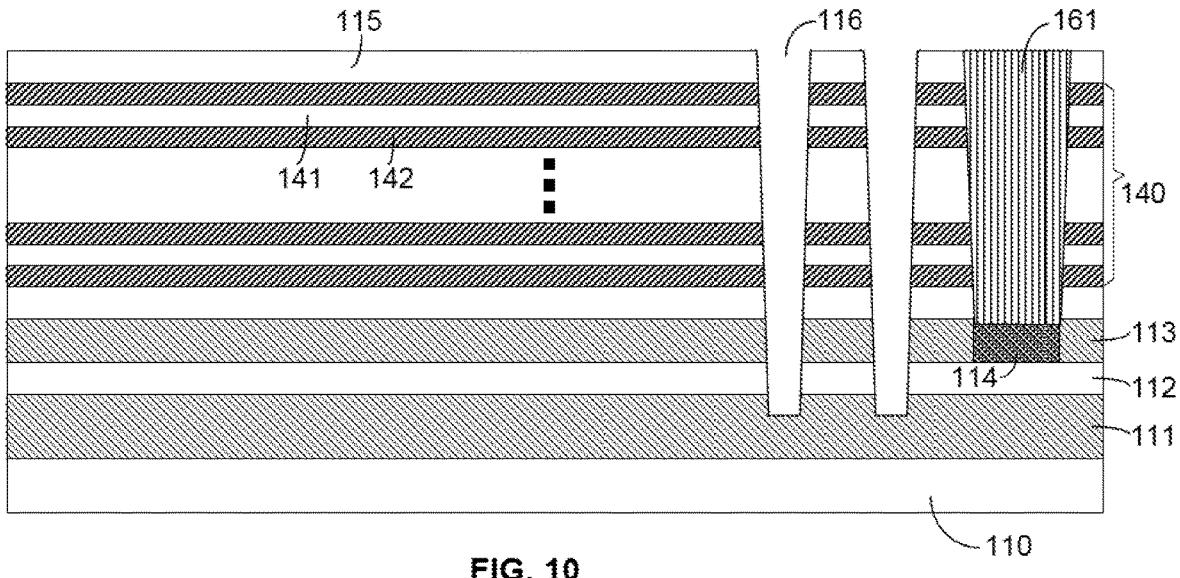

Further, nitrogen-doped silicon carbide (NDC) is deposited via CVD and/or ALD, which fills the opening 160 with a filling structure 161. After the filling process, the filling structure 118 is removed selectively. As the filling structure 118 is carbon, it may be removed by a burning process. Optionally, the filling structure 118 may be removed by a selective etch process such as a selective wet etch process. As shown in FIGS. 9 and 10, the channel holes (or openings 116) reappear, while the opening 160 is filled with the filling structure 161.

Further, a functional layer 151 is deposited on the sidewall and bottom surface of the channel hole. The functional layer 151 includes a blocking layer on the sidewall to block an outflow of charges, a charge trap layer on a surface of the blocking layer to store charges during an operation of the 3D array device 100, and a tunneling layer on a surface of the charge trap layer. The blocking layer may include one or more layers that may include one or more materials. The material for the blocking layer may include silicon oxide, silicon nitride, silicon oxynitride, a high-k dielectric material such as aluminum oxide or hafnium oxide, or another wide bandgap material. The charge trap layer may include one or more layers that may include one or more materials. The materials for the charge trap layer may include polysilicon, silicon nitride, silicon oxynitride, nanocrystalline silicon, a high-k dielectric material such as aluminum oxide or hafnium oxide, or another wide bandgap material. The tunneling layer may include one or more layers that may include one or more materials. The material for the tunneling layer may include silicon oxide, silicon nitride, silicon oxynitride, a high-k dielectric material such as aluminum oxide or hafnium oxide, or another wide bandgap material.

Further, a semiconductor channel 155 is deposited on a surface of the tunneling layer. The semiconductor channel 155 includes a polysilicon layer in some aspects. Optionally, the semiconductor channel 155 may include an amorphous silicon layer. The semiconductor channel 155 extends through the dielectric stack 140 and into the layer 111 in certain cases. The blocking layer, the charge trap layer, the tunneling layer, and the semiconductor channel 155 may be deposited by, e.g., CVD and/or ALD. The structure formed in a channel hole in the stack 140, including the functional layer 151 and semiconductor channel 155, may be referred to as a lower channel hole structure. Similar to the opening 116, the lower channel hole structure has a taper part extending through the stack 140 in some embodiments.

Figure 11:
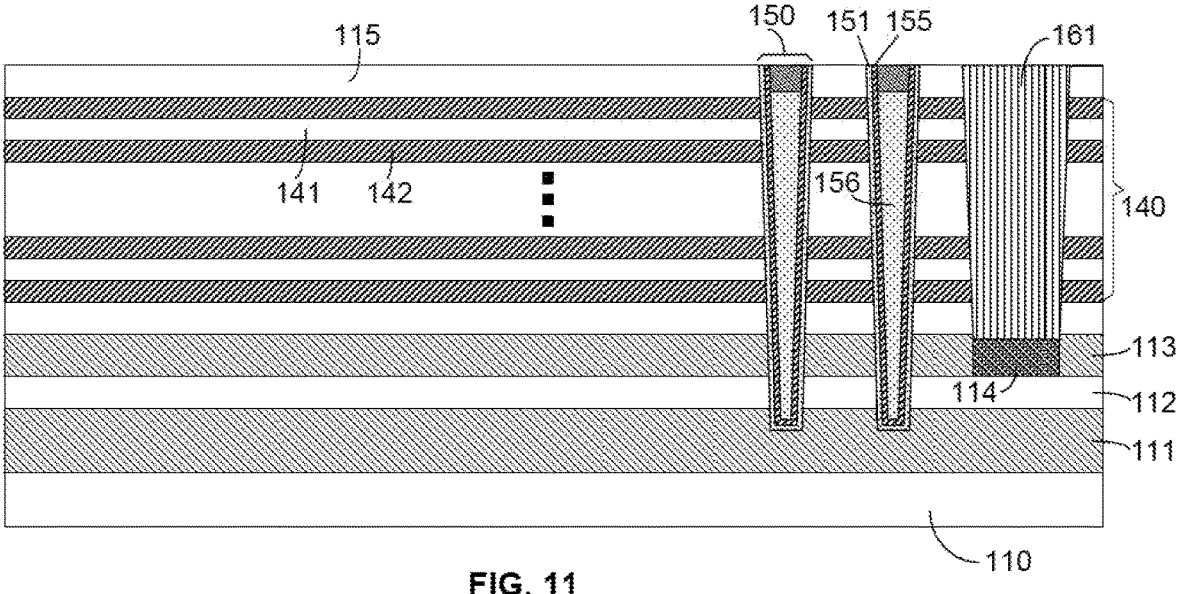
FIG. 11 illustrates a cross-sectional view of the 3D array device shown in FIG. 10 after channel hole structures are formed during the fabrication process according to various aspects of the present disclosure.

After the semiconductor channel 155 is formed, the opening of the channel hole is filled by an oxide material 156 and a conductive plug is formed at the top of the lower channel hole structure, as shown in FIG. 11. The conductive plug is electrically connected to the semiconductor channel 155 and may be formed by, e.g., doped polysilicon. The lower channel hole structures are formed in channel hole regions 150. A conductive plug in the lower channel hole structure may be referred to as a lower conductive plug.

In some cases, the functional layer 151 includes an oxide-nitride-oxide (ONO) structure. That is, the blocking layer is a silicon oxide layer, the charge trap layer is a silicon nitride layer, and the tunneling layer is another silicon oxide layer.

Optionally, the functional layer 151 may have a structure different from the ONO configuration. In the following descriptions, the ONO structure is used exemplarily for the blocking layer, the charge trap layer, and the tunneling layer.

Figure 12:
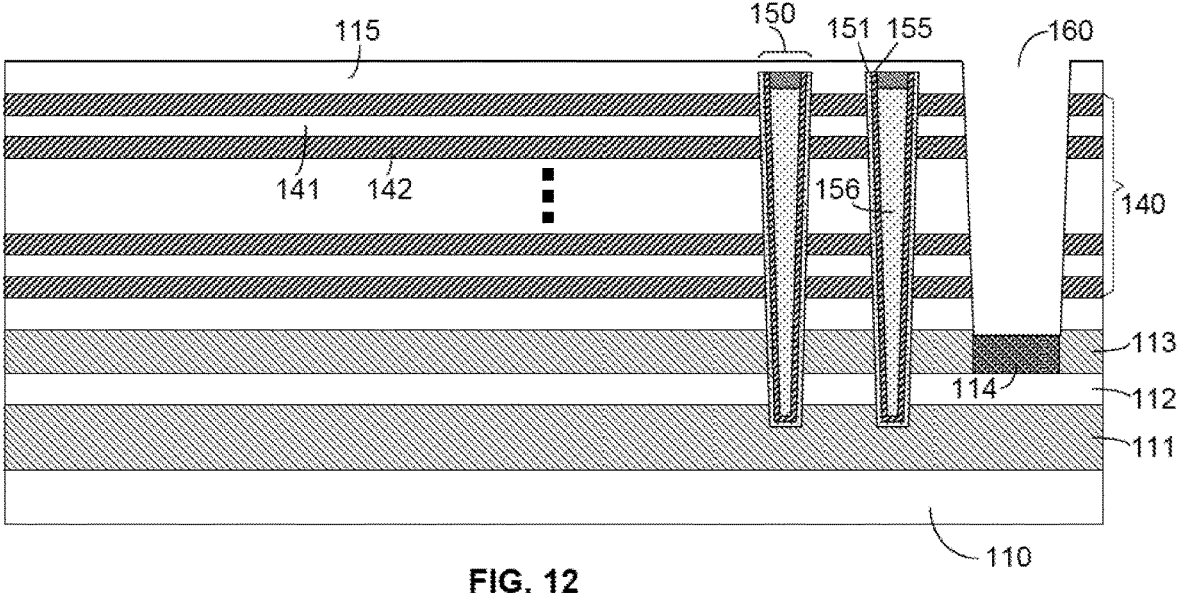
FIGS. 12-17 illustrate cross-sectional views of the 3D array device shown in FIG. 11 at certain stages during the fabrication process according to various aspects of the present disclosure.

Further, an oxidation process is performed. Certain portions at the top of the lower channel hole structure, including a part of the lower conductive plug, are converted into silicon oxide and become a part of the dielectric layer 115. FIG. 12 shows a schematic cross-sectional view of the structure of the 3D array device 100 after the oxidation process and a selective etch process. The selective etch process, e.g., a selective wet etch process, removes the filling structure 161 to make the opening 160 reappear.

Figure 13:
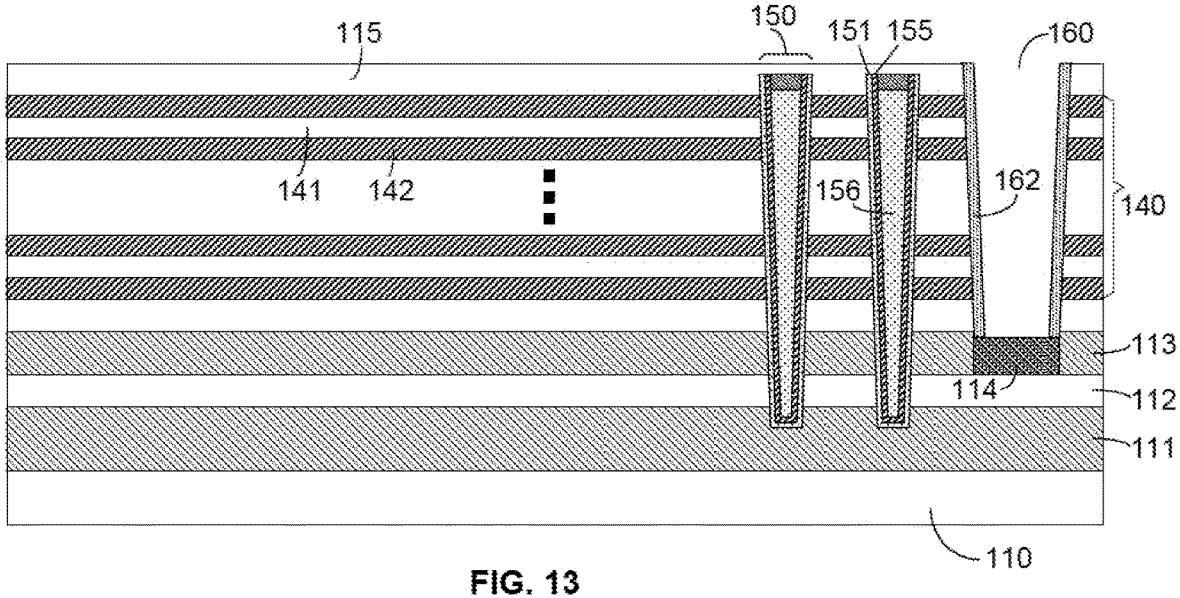

Further, NDC is deposited to form a spacer layer 162 on the sidewall and bottom surface of the opening 160 by CVD and/or ALD. The spacer layer 162 on the sidewall is configured to protect the first and second dielectric layers 141 and 142. In some other cases, the spacer layer 162 may include another material that is different from materials of the layers 141 and 142, such as aluminum oxide. Alternatively, the spacer layer 162 may include a multilayer that contains layers similar to the layers 141 and 142. The layer 162 at the bottom of the opening 160 is subsequently removed by an etch, e.g., a dry etch. The etch exposes the carbon block 114 at the bottom of the opening 160, as shown in FIG. 13.

Figure 14:
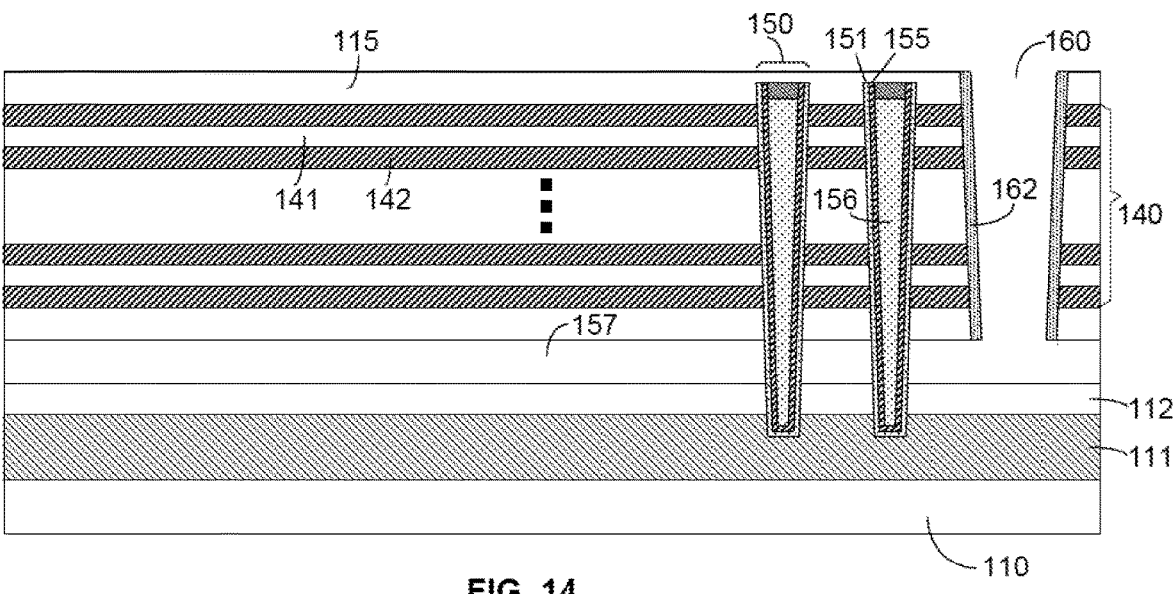
Figure 15:
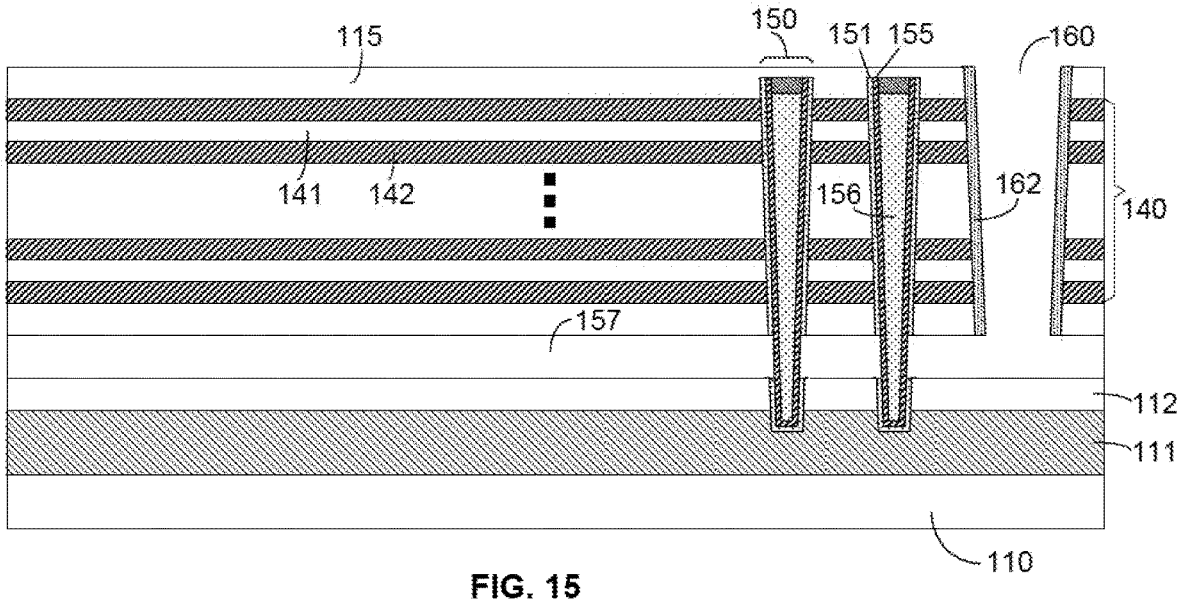

Further, one or more selective etch processes, e.g., selective wet etch processes, are performed to remove the carbon block 114 and layer 113, respectively. As shown in FIG. 14, removal of the layer 113 creates a cavity 157 and exposes the layer 112 and certain portions of the blocking layers formed in the lower sections of the channel holes. Then, multiple selective etch processes, e.g., multiple selective wet etch processes, are performed to remove the exposed portions of the blocking layer, the charge trap layer, and the tunneling layer consecutively, which exposes portions of the semiconductor channel 155 in the cavity 157, as shown in FIG. 15. In some cases, the blocking layer, tunneling layer, and layer 112 are silicon oxide. When the blocking and tunneling layers are etched, the layer 112 is etched as well. Provided the layer 112 is much thicker than the blocking and tunneling layers. As such, the layer 112 remains in the cavity 157 and the thickness change of the layer 112 is not shown in FIG. 15 for simplicity.

Figure 16:
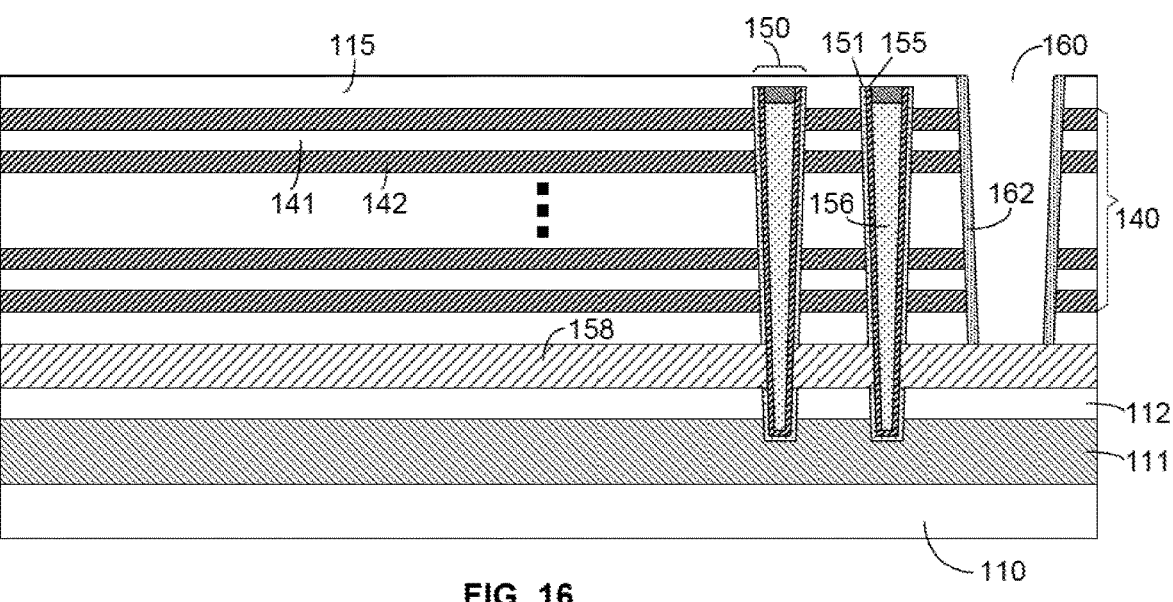

After the etch processes, the layer 112 and certain lower parts of the semiconductor channels 155 are exposed in the cavity 157. As shown in FIG. 16, the cavity is filled by a semiconductor material, e.g., polysilicon, to form a semiconductor layer 158. A CVD and/or ALD deposition process may be performed. The semiconductor layer 158 is n-doped, formed on the exposed surface of the layer 112 and exposed parts of the semiconductor channels 155. The semiconductor layer 158 passes through the functional layer 151, surrounds the exposed parts of the semiconductor channel 155, and electrically contacts the semiconductor channel 155. The sacrificial layer 113 is removed when there is only one dielectric stack, i.e., the stack 140. The single stack structure has a lower risk of mechanical instability compared a multi-stack structure when the cavity 157 is created. As such, the yield and reliability may be improved.

Figure 17:
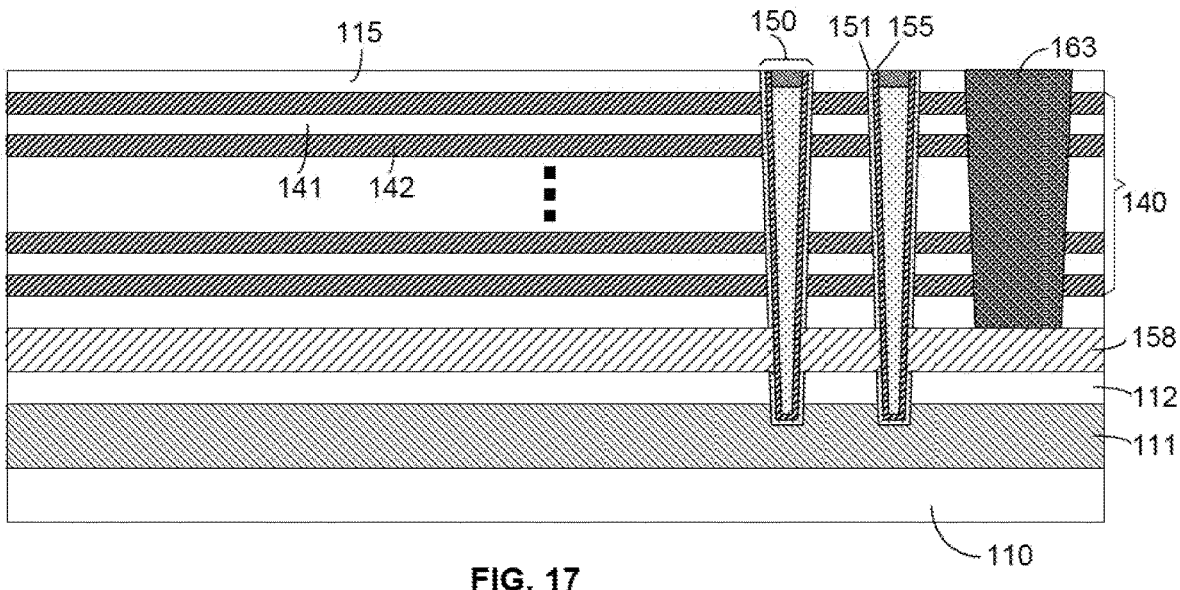

Further, a selective etch process such as a selective wet etch process is performed to remove the spacer layer 162 on the sidewall of the opening 160. The opening 160 is then filled with a carbon material by CVD and/or ALD. As shown in FIG. 17, a filling structure 163 fills the opening 160 and then a chemical mechanical polishing (CMP) may be conducted for a planarization process. In some cases, a cavity (not shown) forms inside the filling structure 163.

Figure 18:
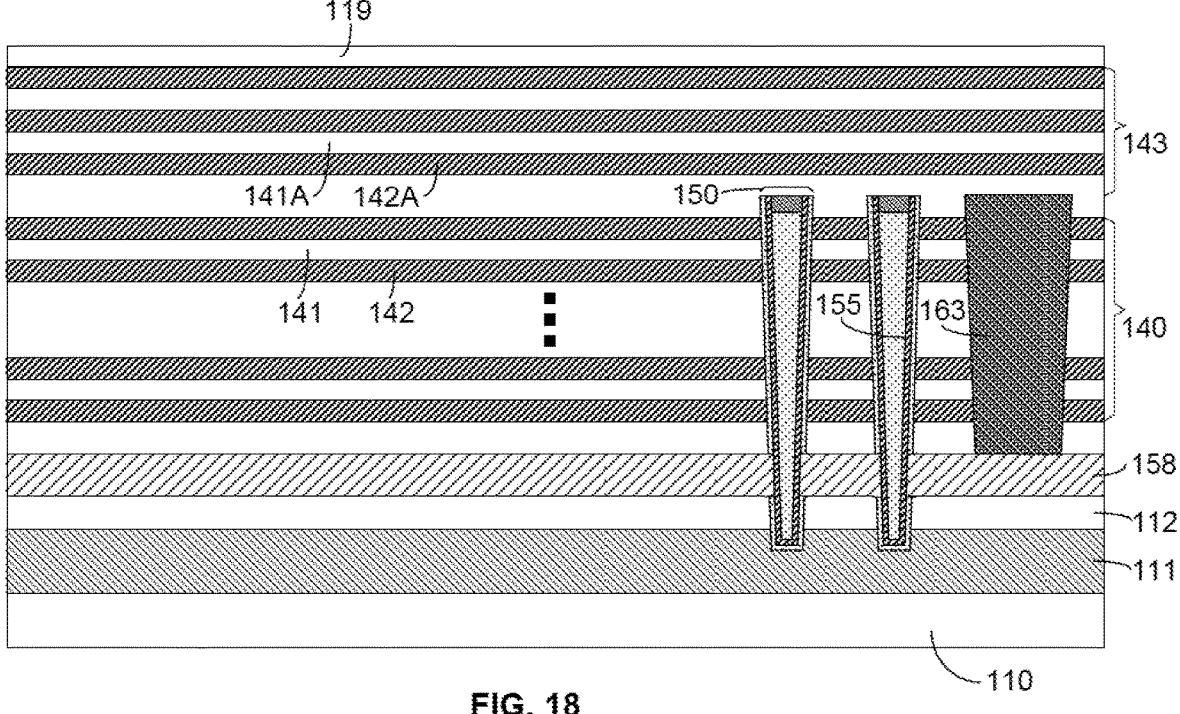
FIG. 18 illustrates a cross-sectional view of the 3D array device shown in FIG. 17 after another dielectric stack structure is made according to various aspects of the present disclosure.

Optionally, in order to increase the layers for memory cells, a dielectric stack 143 is formed over the layer 115, the filling structure 163, and dielectric stack 140, and a dielectric layer 119 is formed over the dielectric stack 143, which is illustrated in FIG. 18. The layer 119 may include silicon oxide. The dielectric stack 143 is aligned to the stack 140 along the Z direction or a direction approximately perpendicular to the substrate 110. Similar to the dielectric stack 140, the stack 143 includes multiple pairs of stack layers, for example, including third dielectric layers 141A and fourth dielectric layers 142A, stacked alternately over each other. In some cases, the layers for fabricating memory cells may include 64 pairs, 128 pairs, or more than 128 pairs of the third and fourth dielectric layers 141A and 142A.

In some aspects, the third dielectric layer 141A includes a silicon oxide layer exemplarily, which may be used as an isolation stack layer, while the fourth dielectric layer 142A includes a silicon nitride layer exemplarily, which may be used as a sacrificial stack layer. The third dielectric layers 141A and fourth dielectric layers 142A may be deposited via CVD, PVD, ALD, or a combination thereof.

Figure 19:
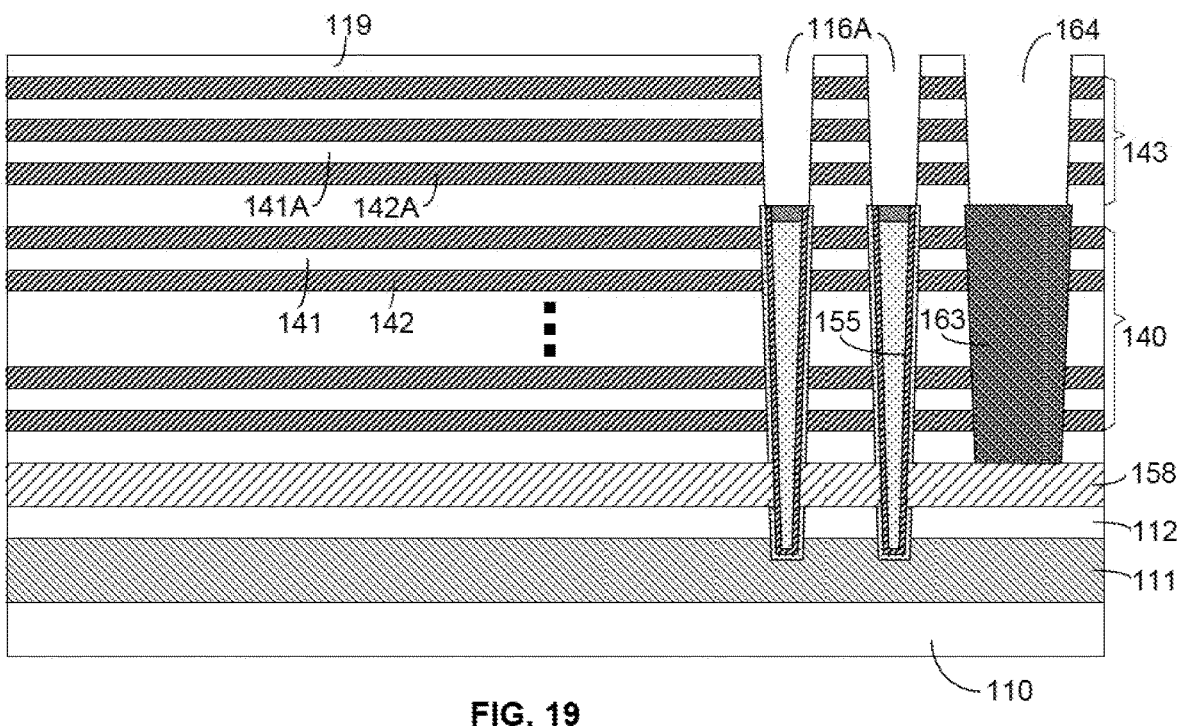
FIGS. 19-22 illustrate cross-sectional views of the 3D array device shown in FIG. 18 at certain stages during the fabrication process according to various aspects of the present disclosure.
Figure 20:
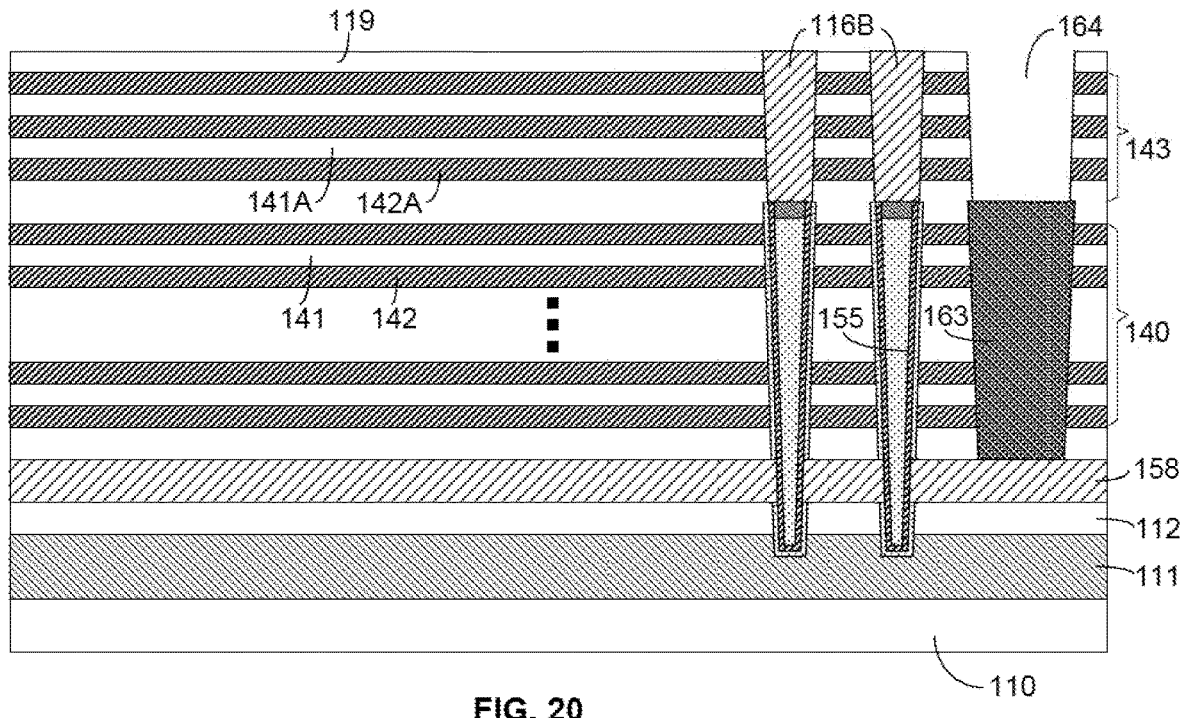
Figure 21:
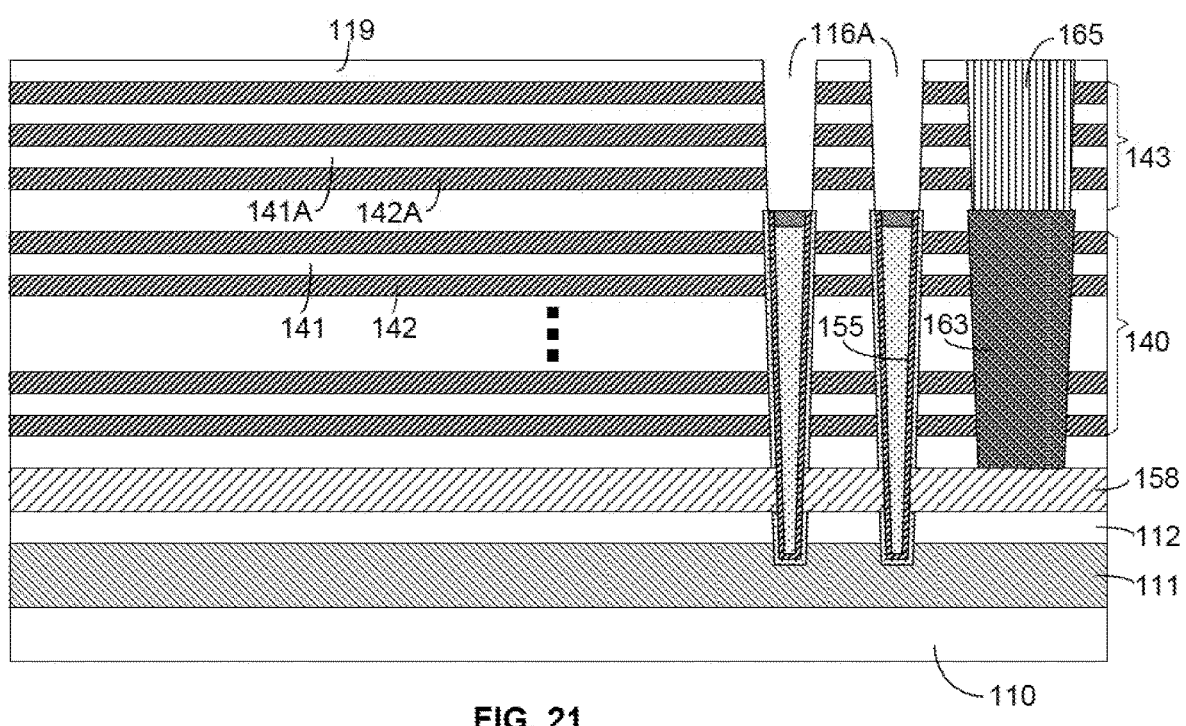

FIG. 19 show a schematic cross-sectional view of the structure of the 3D array device 100 after openings 116A and 164 are etched according to aspects of the present disclosure. The opening 116A may be referred to as a channel hole and is made for forming an upper channel hole structure, while the opening 164 is made for GLS. The openings 116A and 164 are aligned to and expose the lower channel hole structures and the filling structure 163, respectively. The openings 116A and 164 may be formed simultaneously by, for example, a selective dry etch process or a combination of selective dry and selective wet etch processes. At the bottom of the opening 116A, the lower conductive plug of the lower channel hole structure appears.

The channel holes (i.e., the openings 116A) and opening 164 pass through the dielectric stack 143 in the Z direction. Optionally, the quantity and pattern of the openings 116A and 164 in an X-Y plane may be the same as or similar to that of the openings 116 and 160 with respect to FIG. 6. Similar to the openings 116 and 160, the openings 116A and 164 may have a taper part extending through the dielectric stack 143 in some aspects. As the opening 116A tapers toward the bottom, the bottom dimension of the opening 116A is smaller than the top dimension of the lower channel hole structure. For the same reason, the bottom width of the opening 164 is smaller than the top width of the filling structure 163.

The channel holes and the opening for GLS (i.e., the opening 164) may be formed at the same time by the same process. Compared to etching the channel holes and the opening for GLS separately in two processes, the fabrication cost may be reduced in some cases.

Further, polysilicon is deposited to fill the channel holes by CVD and/or ALD. A filling structure 116B is formed in the channel hole. The polysilicon layer deposited inside the opening 164 is subsequently etched away by a timed selective etch (e.g., a selective wet etch), exposing the filling structure 163. The filling structure 116B and the opening 164 after the timed selective etch are shown schematically in FIG. 20.

Thereafter, NDC or carbon is deposited to fill the opening 164 by CVD and/or ALD. A filling structure 165 is formed over the filling structure 163 in the opening 164, followed by a planarization process. The top of the filling structure 163 and the bottom of the filling structure 165 are connected. The bottom width of the filling structure 165 is smaller than the top width of the filling structure 163 in the X direction. Further, a selective etch (e.g., a selective wet etch) is performed to remove the filling structures 116B and the openings 116A reappear. The filling structure 165 and the openings 116A after the selective etch are shown schematically in FIG. 21. The selective etch exposes the lower conductive plugs of the lower channel hole structures. In certain cases, the lower conductive plug is made from polysilicon. In these cases, the selective etch is arranged such that part of the lower conductive plug may be etched away in the selective etch, while a certain portion of the lower conductive plug remains there.

After the openings 116A are formed by the selective etch, the lower conductive plugs are exposed. Further, a functional layer 151A is deposited on the sidewall and bottom surface of the channel hole (i.e., the opening 116A) by CVD and/or ALD. The functional layer 151A may be the same as or similar to the functional layer 151 with respect to FIG. 11. The functional layer 151A includes a blocking layer, a charge trap layer on a surface of the blocking layer, and a tunneling layer on a surface of the charge trap layer. Further, an etch such as a dry etch is performed to etch away the functional layer 151A at the bottom of the channel hole, exposing the remaining lower conductive plug underneath the opening 116A.

Further, a semiconductor channel 155A is deposited on the surface of the tunneling layer and the remaining lower conductive plug at the bottom of the opening 116A by CVD and/or ALD. The semiconductor channel 155A includes a polysilicon layer in some aspects. The semiconductor channel 155A extends through the dielectric stack 143 and is electrically connected with the semiconductor channel 155 via the remaining lower conductive plug. The structure formed in the channel hole or opening 116A, including the functional layer 151A and semiconductor channel 155A, may be referred to as an upper channel hole structure. Similar to the openings 116A, the upper channel hole structure has a taper part extending through the dielectric stack 143 in some aspects. The taper parts of the upper and lower channel hole structures have connected ends with different dimensions. The bottom dimension of the upper channel hole structure is smaller than the top dimension of the lower channel hole structure.

Figure 22:
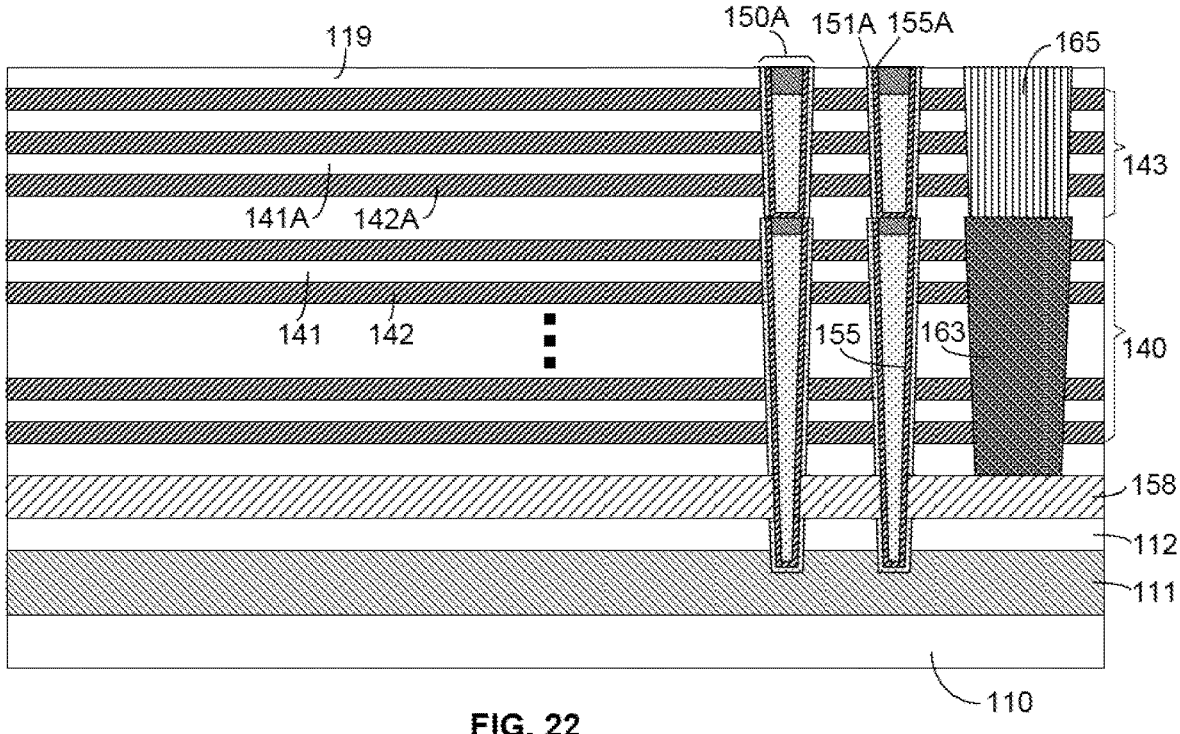

After the semiconductor channel 155A is formed, the opening of the channel hole is filled by an oxide material and a conductive plug is formed at the top of the upper channel hole structure, as shown in FIG. 22. The conductive plug is connected to the semiconductor channel 155A and may be formed by, e.g., doped polysilicon. The upper channel hole structures are formed in channel hole regions 150A. The conductive plug in the upper channel hole structure may be referred to as an upper conductive plug.

Figure 23:
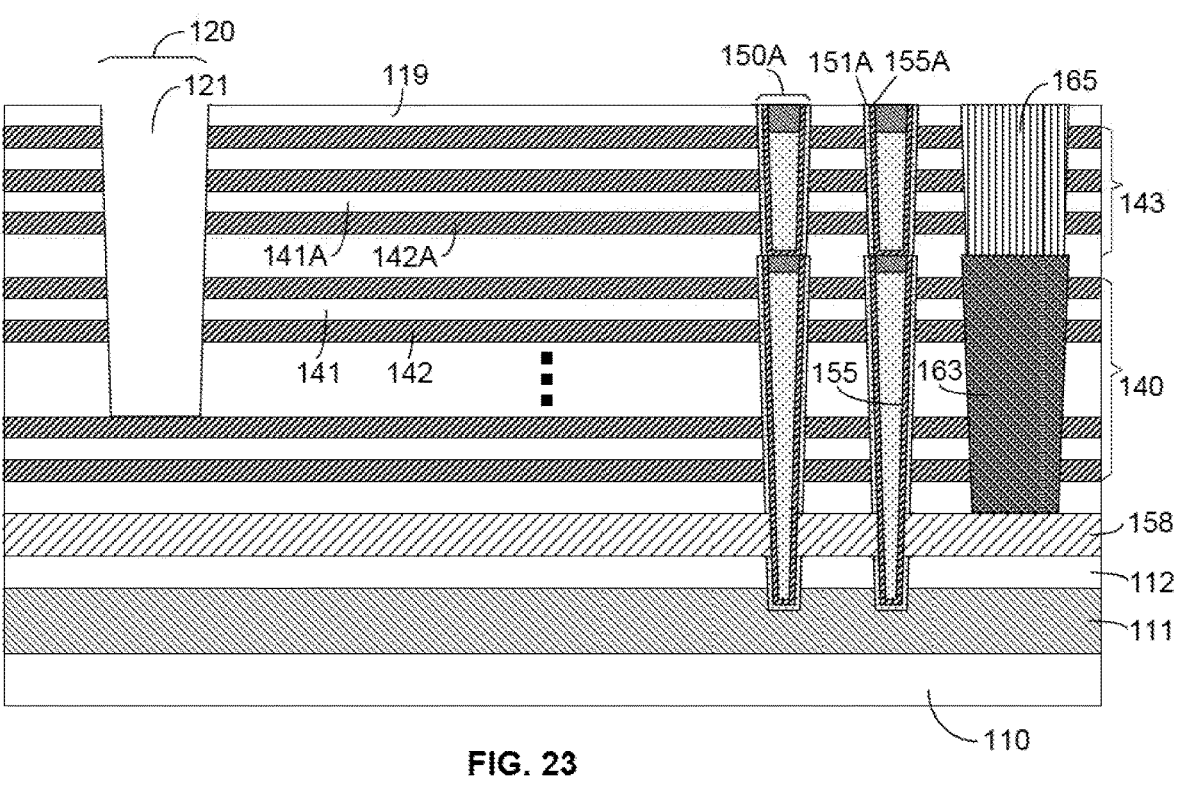
FIGS. 23-25 illustrate cross-sectional views of the 3D array device shown in FIG. 22 at certain stages during the fabrication process according to various aspects of the present disclosure.
Figure 24:
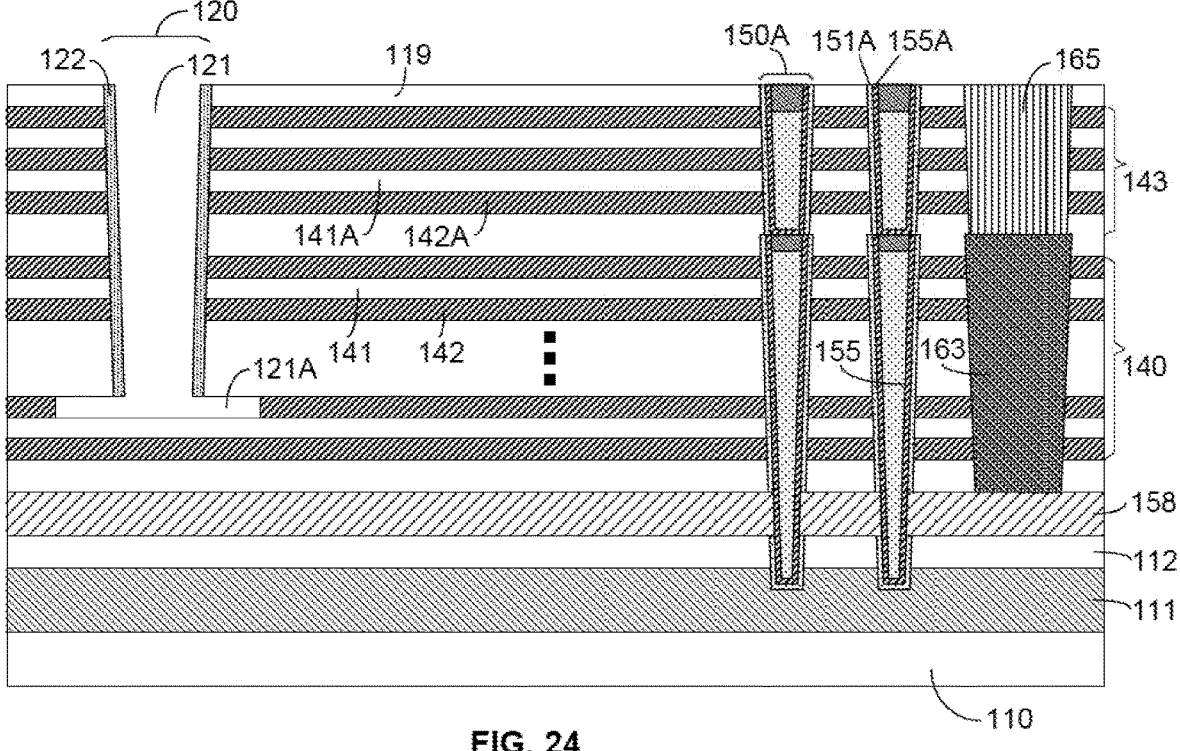
Figure 25:
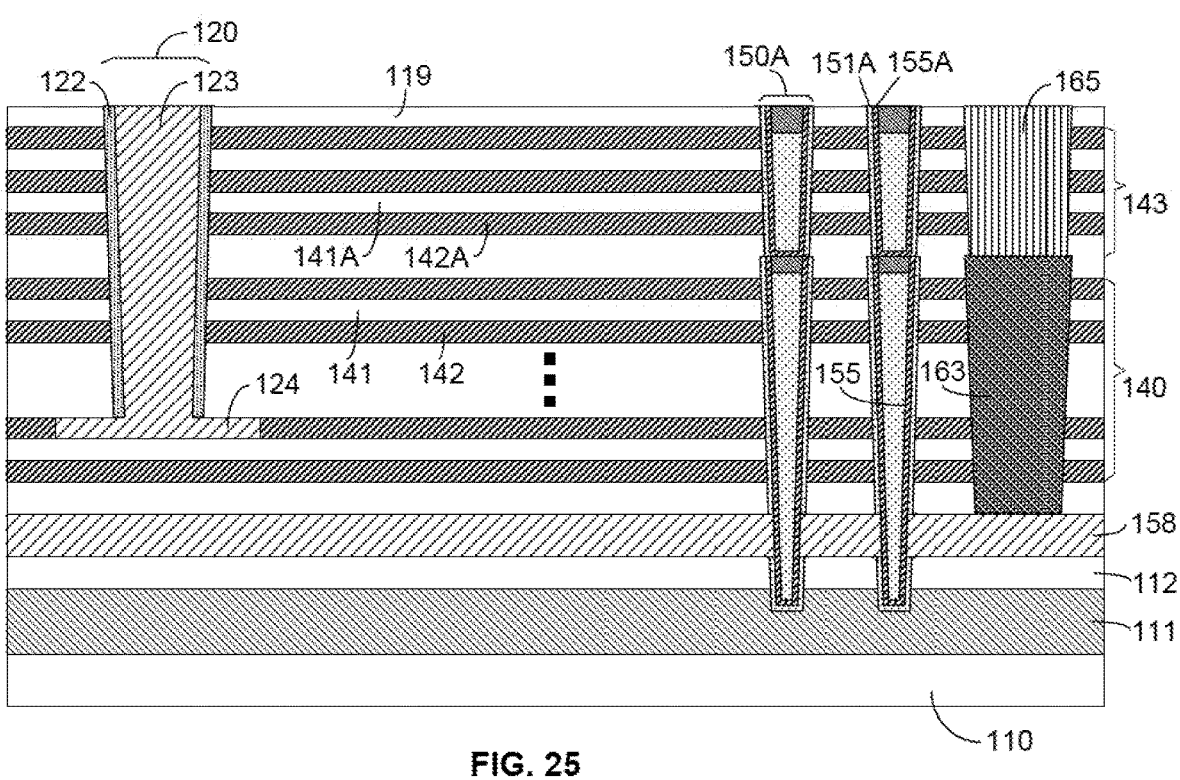

FIG. 23 shows a schematic cross-sectional view of the structure of the 3D array device 100 after an opening 121 for a staircase contact (SCT) is formed according to aspects of the present disclosure. The opening 121 is in an SCT region 120 as depicted in the figure. The opening 121 may be formed by, for example, a dry etch process or a combination of dry and wet etch processes. The opening may extend through the dielectric stack 143 or stacks 143 and 140 in the Z direction to reach a target layer, such as a dielectric layer 142A or 142. The opening 121 has a taper angle in some cases. Provided the opening 121 penetrates through the stacks 143 and 140 and at the bottom of the opening 121, exposes a target dielectric layer 142 of the stack 140. Further, a dielectric material (e.g., aluminum oxide) is deposited to grow a spacer layer 122 on the sidewall and bottom surface of the opening 121 by CVD or ALD. The spacer layer 122 may be configured to electrically isolate the SCT. Further, an etch, such as a dry etch, is conducted to etch away the spacer layer 122 at the bottom of the opening 121, exposing the target dielectric layer 142 again. Then, a selective etch, such as a selective wet etch, is arranged to etch out a portion of the target dielectric layer 142 (i.e., a silicon nitride layer). The selective etch may last for a predetermined time to create a cavity 121A after the portion of the layer 142 is removed, as shown in FIG. 24. After the etch, a material such as polysilicon is deposited to fill the opening 121 and cavity 121A by CVD and/or ALD. The deposition process creates a filling structure 123 in the opening 121 and a layer 124 in the cavity 121A, as depicted in FIG. 25. The layer 124 is between the dielectric layers 141. In some cases, a void forms in the filling structure 123.

Figure 26:
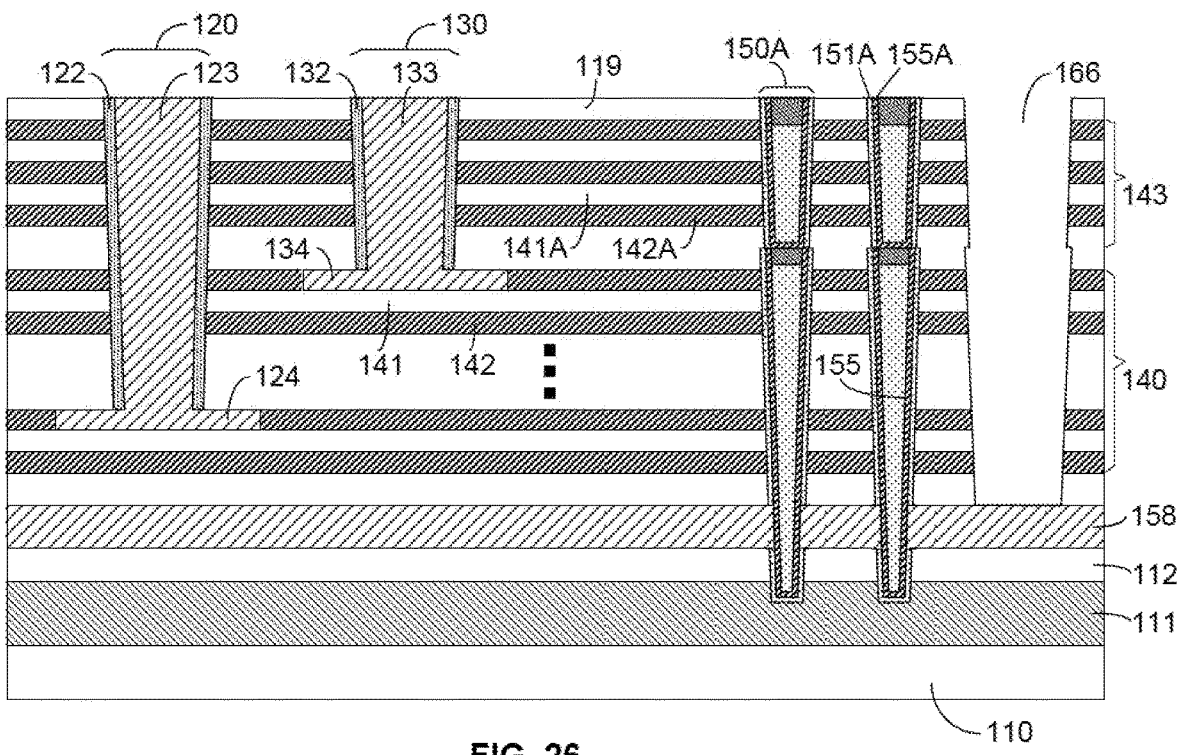
FIGS. 26 and 27 illustrate a cross-sectional view and a top view of the 3D array device shown in FIG. 25 at a certain stage during the fabrication process according to various aspects of the present disclosure.
Figure 27:
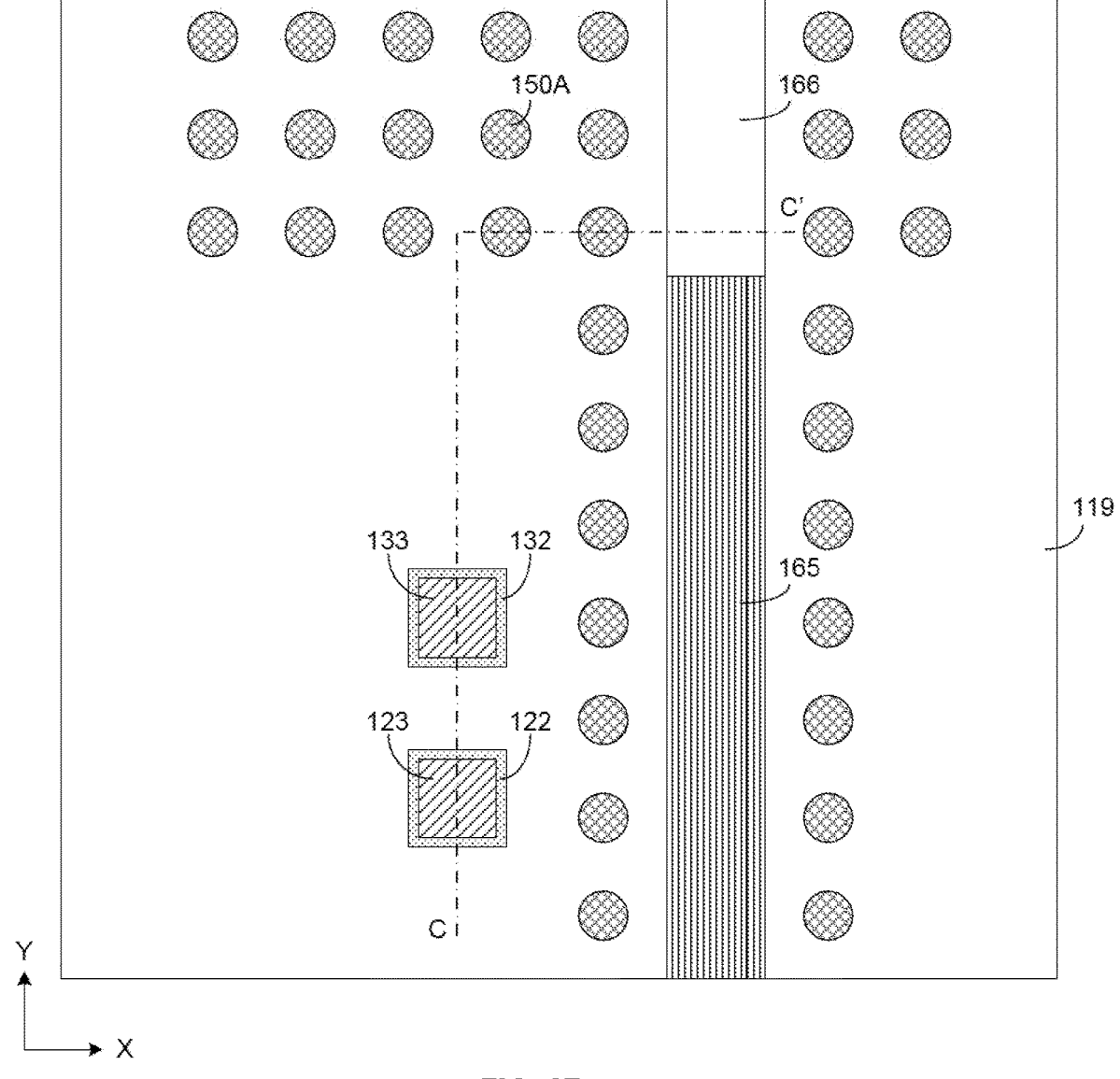

FIGS. 26 and 27 show a schematic cross-sectional view and a schematic top view of the structure of the 3D array device 100 after a filling structure 133 and an opening 166 are formed according to aspects of the present disclosure. The cross-sectional view shown in FIG. 26 is taken along a line CC' of FIG. 27. After the filling structure 123 is made in the SCT region 120, similar processes may be performed to etch additional openings and fill these openings with filling structures. Provided an opening (not shown) is formed in an SCT region 130, exposing a target dielectric layer 142 of the stack 140. A dielectric material (e.g., aluminum oxide) is deposited to grow a spacer layer 132 on the sidewall and bottom surface of the opening. The spacer layer 132 at the bottom of the opening is etched to expose the target dielectric layer 142. A selective etch is performed to remove a portion of the target dielectric layer 142 to create a cavity (not shown). Thereafter, a material such as poly-silicon is deposited to fill the opening and cavity, creating a filling structure 133 and a layer 134.

A planarization process may be performed by CMP after the filling structure 133 is made. Further, one or more selective etches, such as selective wet etches, are performed to etch away filling a part of the structures 165 and 163, respectively. An opening 166 is formed that extends through the dielectric stacks 143 and 140 along the Z direction and exposes the semiconductor layer 158. For reasons illustrated above, the opening 166 has taper parts through the dielectric stacks 140 and 143, respectively, in some cases.

Figure 28:
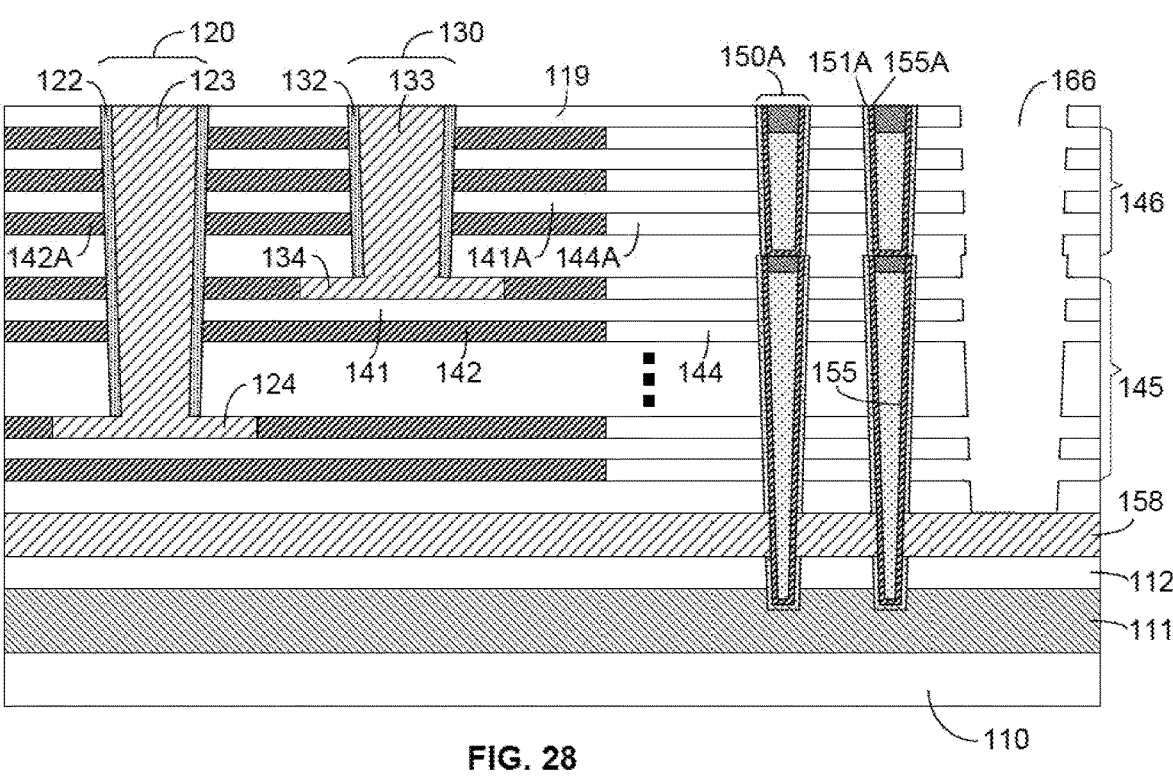
FIGS. 28-30 illustrate cross-sectional and top views of the 3D array device shown in FIGS. 26 and 27 at certain stages during the fabrication process according to various aspects of the present disclosure.

As shown in FIG. 27, the selective etch removes a part of the filling structure 165, while the remaining filling structure 165 stay there. The opening 166 exposes sides of the dielectric layers 142 and 142A of the dielectric stacks 140 and 143. Further, a selective etch (e.g., a selective wet etch) is performed to remove certain portions of the dielectric layers 142 and 142A, leaving cavities 144 between the dielectric layers 141 and cavities 144A between dielectric layers 141A, as shown in FIG. 28. As such, parts of the dielectric stacks 140 and 143 are changed into dielectric stack 145 and 146, respectively.

Figure 29:
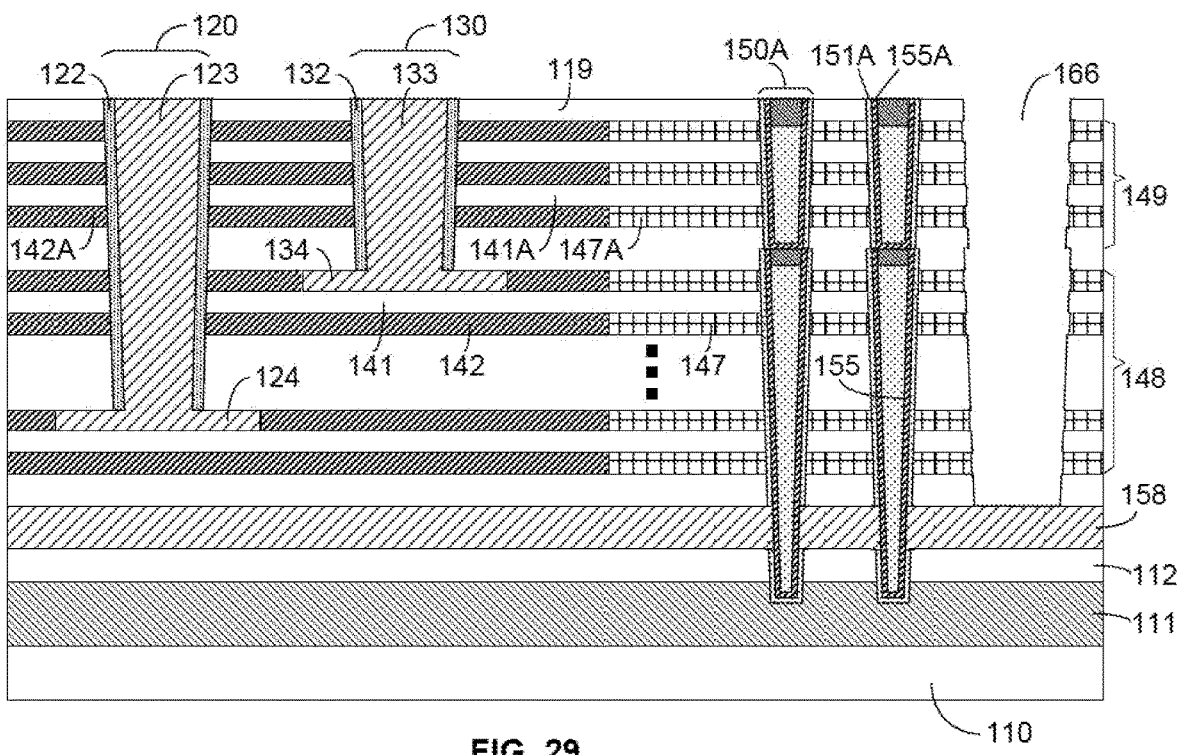

Further, a conductive material such as tungsten (W) is grown to fill the cavities 144 and 144A, forming conductive layers 147 and 147A, respectively. After the conductive layers 147 and 147A are made, the dielectric stacks 145 and 146 are converted into conductor/insulator stacks 148 and 149, as shown in FIG. 29. The conductor/insulator stack 148 (or 149) may be referred to as a conductor/insulator stack structure that has the dielectric layers 141 (or 141A) and the conductive layers 147 (or 147A) alternatingly stacked over each other. The stacks 148 and 149 contain the upper and lower channel hole structures, including the functional layers 151 and 151A and semiconductor channels 155 and 155A. The stacks 148 and 149 may also be referred to as decks that are stacked and aligned in the Z direction or vertical direction. The upper and lower channel hole structures each have a taper part through a conductor/insulator stack (the stack 148 or 149), in some cases.

In some aspects, before metal W is deposited in the cavities 144 and 144A, a layer (not shown) of a high-k dielectric material such as aluminum oxide may be deposited. Thereafter, a layer of a conductive material such as titanium nitride (TiN) (not shown) is deposited. Further, metal W is deposited to form the conductive layers 147 and 147A. CVD and/or ALD may be used in the deposition processes. Alternatively, another conductive material, such as molybdenum (Mo), ruthenium (Ru), cobalt (Co), copper (Cu), aluminum (Al), titanium (Ti), tantalum (Ta), tantalum nitride (TaN), doped silicon, or any combination thereof, may be used to form the conductive layers 147 and 147A.

Referring to FIG. 29, a portion of each functional layer 151 (or 151A) in a channel hole structure is between a portion of one of the conductive layers 147 (or 147A) and a portion of a semiconductor channel 155 (or 155A) in the channel hole structure. Each conductive layer 147 (or 147A) is configured to connect rows of NAND memory cells in an X-Y plane and is configured as a word line for the 3D array device 100. A pair of the connected semiconductor channels 155 and 155A is configured to connect a column or a string of NAND memory cells along the Z direction and configured as a bit line for the 3D array device 100. As such, a portion of the functional layer 151 (or 151A) in an X-Y plane, as a part of a NAND memory cell, is arranged between a conductive layer 147 (or 147A) and a semiconductor channel 155 (or 155A), i.e., between a word line and a bit line. The functional layer 151 (or 151A) may also be considered as disposed between the semiconductor channel 155 (or 155A) and the conductor/insulator stack 148 (or 149). A portion of the conductive layer 147 (or 147A) that is around a portion of the lower (or upper) channel hole structure functions as a control gate or gate electrode for a NAND memory cell. The 3D array device 100 can be considered as including a 2D array of strings of NAND cells (such a string is also referred to as a "NAND string") in the stacks 148 and 149 or the conductor/insulator stack structures. Each NAND string contains multiple NAND memory cells and extends vertically toward the substrate 110. The NAND strings form a 3D array of the NAND memory cells through the conductor/insulator stacks 148 and 149 over the substrate 110.

Figure 30:
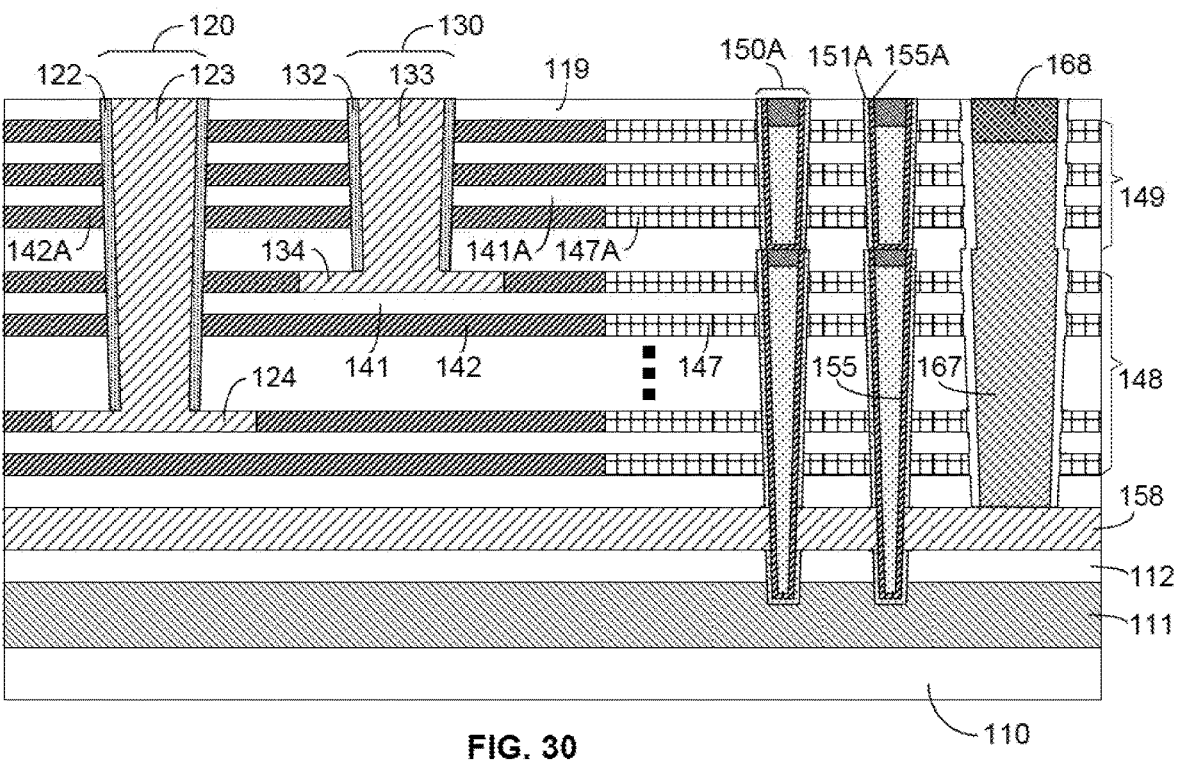
Figure 31:
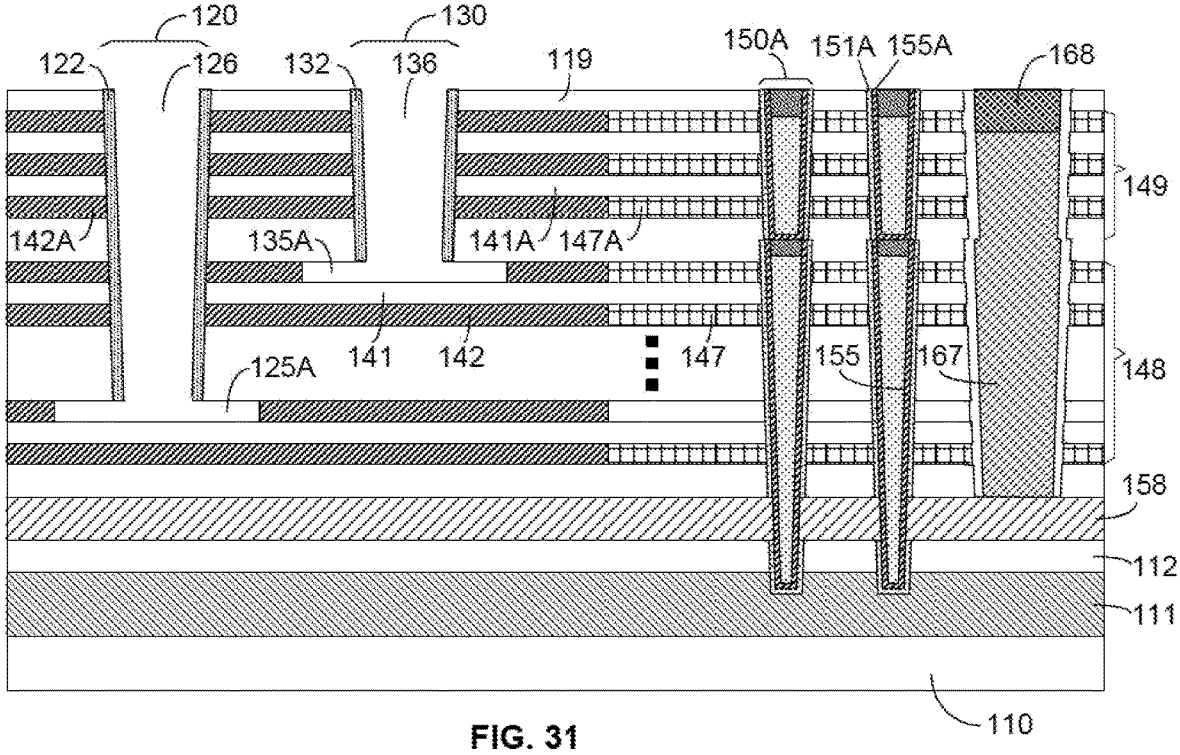
FIGS. 31-33 illustrate cross-sectional views of the 3D array device shown in FIG. 30 at certain stages during the fabrication process according to various aspects of the present disclosure.

After the conductive layers 147 and 147A are grown in the cavities, a dielectric layer (e.g., a silicon oxide layer) is deposited on the sidewall and bottom surface of the opening 166 by CVD and/or ALD. A dry etch process or a combination of dry etch and wet etch processes is performed to remove the dielectric layer at the bottom of the opening 166 to expose a part of the semiconductor layer 158. The opening 166 is filled with a conductive material (e.g., doped polysilicon) and a conductive plug 168 (e.g., metal W). The conductive material forms a conductive filling structure 167 in the opening that extends through the conductor/insulator stacks 148 and 149 and electrically contacts the semiconductor layer 158, as shown in FIG. 30. The materials deposited in the opening 166 form the GLS structure. The conductive filling structure 167 is considered as an array common source for the 3D array device 100 in some aspects. Optionally, forming the array common source in the opening 166 includes depositing a conductive layer (such as TiN, W, Co, Cu, or Al), and then a conductive material such as doped polysilicon.

The GLS structure has a lower taper part and upper taper part extending through the conductor/insulator stack 148 and 149 in the vertical direction or Z direction, respectively, in some cases. The lower and upper taper parts taper along the vertical direction. For example, the horizontal dimension of the top end of the lower (or upper) taper part is larger than the horizontal dimension of the bottom end of the lower (or upper) taper part, as shown in FIG. 30. The top end of the lower taper part connects with the bottom end of the upper taper part. In some cases, the horizontal dimension of the top end of the lower taper part is larger than the horizontal dimension of the bottom end of the upper taper part, as shown in FIG. 30. In some other cases, the horizontal dimension of the top end of the lower taper part is smaller than the horizontal dimension of the bottom end of the upper taper part by a predetermined value. In these cases, when the opening 164 is made to expose the filling structure 163, the horizontal dimension of the bottom of the opening 164 is larger than the horizontal dimension of the top of the filling structure 163 by a certain value. As such, the bottom of the opening 164 completely overlaps the top of the filling structure 163 with certain margins in the vertical direction.

Further, a selective etch (e.g., a selective wet etch) is performed to remove the filling structures 123 and 133 and layers 125 and 135 in the SCT regions 120 and 130, forming openings 126 and 136, and cavities 125A and 135A between the dielectric layers 141. Before the etch, a dielectric layer (not shown) may be deposited over the channel hole structure regions 150A to protect the upper channel hole structures. Certain conductive layers 147 (not shown) are exposed in the cavities 125A and 135A, while the spacer layers 122 and 132 remain as the sidewalls of the openings 126 and 136.

After the conductive layers 147 are exposed in the cavities 125A and 135A, a conductive material (e.g., W) is deposited to fill the cavities and form conductive layers over the spacer layers 122 and 132, respectively. The partially filled opening 126 and 136 are then filled with a dielectric material (e.g., silicon oxide), forming filling structures 128 and 138. Cavities may form in the filling structures 128 and 138 in some cases. The conductive material (e.g., W) is deposited again to make SCTs 127 and 137 in the SCT regions 120 and 130, respectively. The SCTs 127 and 137 are respectively connected to the conductive layers 147 electrically and used as contacts of word lines.

With reference to FIG. 22, a third dielectric stack (not shown) may be deposited over the stack 143 in certain other embodiments. The third dielectric stack may have a similar structure to that of the dielectric stack 140 or 143. With methods similar to that illustrated above, openings may be made that are aligned to the upper channel hole structures and the filling structure 165, an additional filling structure may be deposited on the filling structure 165, and additional channel hole structures may be formed that are aligned to and electrically connected with the upper channel hole structures. Then, three conductor/insulator stacks may be formed. A combined channel hole structure includes three sections or three taper parts passing through the three conductor/insulator stacks, respectively. The GLS structure also includes three taper parts passing through the three conductor/insulator stacks, respectively.

With reference to FIG. 19, when the openings 116A are etched, the opening 164 may not be etched in some cases. In these cases, after the upper channel hole structures are made, a third dielectric stack (not shown) may be deposited over the stack 143. The third dielectric stack may have a similar structure to that of the dielectric stack 140 or 143. With methods similar to that illustrated above, openings may be made that are aligned to the upper channel hole structures, and then additional channel hole structures may be formed that have a taper angle and are aligned to and electrically connected with the upper channel hole structures. Further, an opening may be formed that has a taper angle, is aligned to the filling structure 163, extends through the third dielectric stack and the dielectric stack 143, and exposes the filling structure 163. Further, three conductor/insulator stacks may be formed. A combined channel hole structure includes three sections or three taper parts extending through the three conductor/insulator stacks, respectively. The GLS structure includes two taper parts that are connected with ends of different dimensions. One taper part of the GLS structure extends through the upper two conductor/insulator stacks, while the other taper part extends through the bottom conductor/insulator stack.

Figures 32, 33:
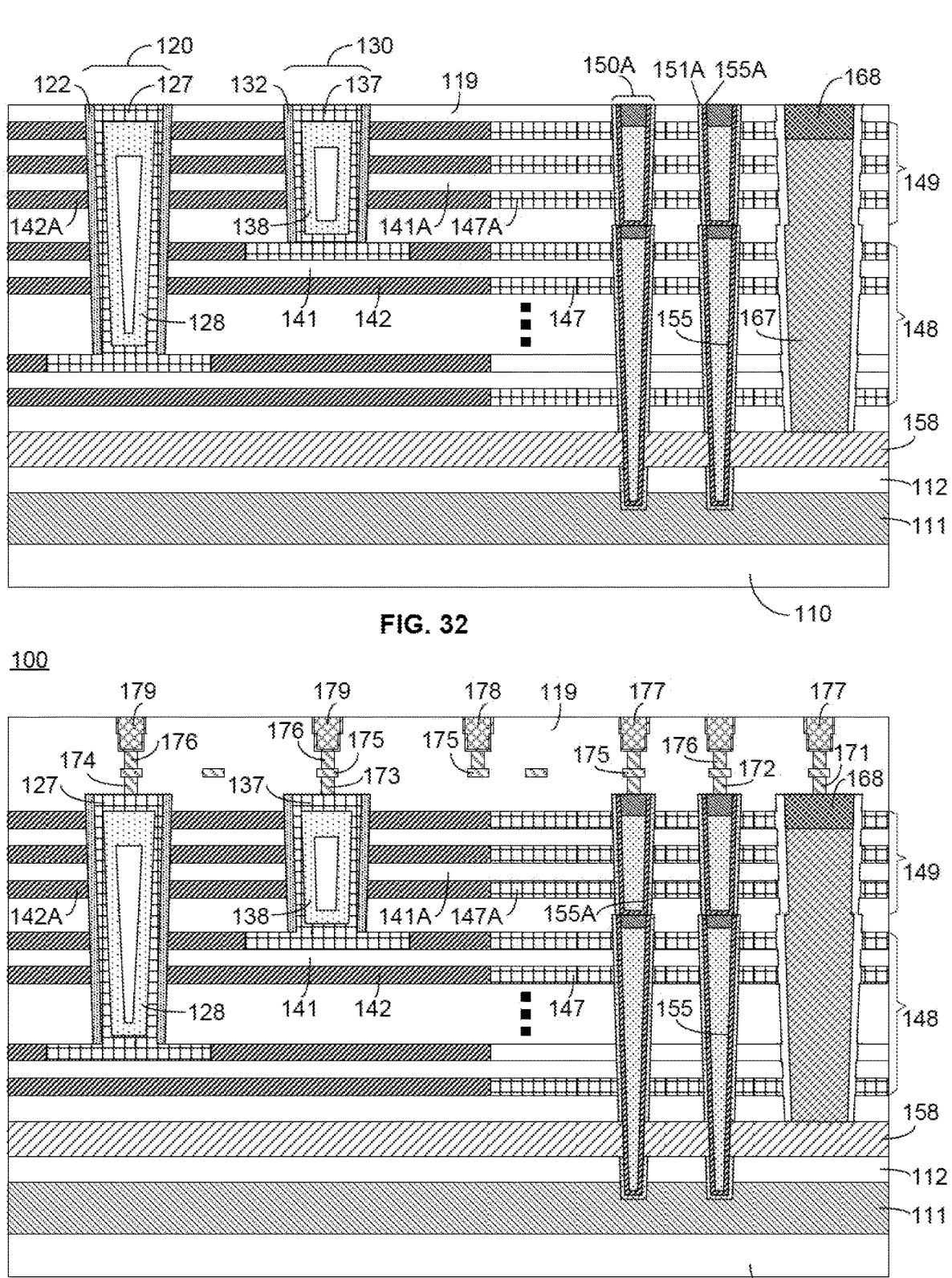

Referring to FIG. 32, a CVD or PVD process is performed to deposit a dielectric material (e.g., silicon oxide) to cover the SCT regions 120 and 130 and the channel hole structure regions 150A, thickening the dielectric layer 119. Openings (not shown) for vias 171-174 are formed by a dry etch process or a combination of dry and wet etch processes. The openings are subsequently filled by a conductive material (e.g., W, Co, Cu, Mo, Ru, or Al) to form the vias 171-174. The vias 171-174 electrically contact the array common source, the upper conductive plugs, and the SCTs, respectively. Optionally, a layer of a conductive material (e.g., TiN) may be deposited as a contact layer before another conductive material is deposited when the vias 171-174 are fabricated.

Further, conductor layers 175 for interconnect are grown by CVD, PVD, and/or ALD. The conductor layers 175 are deposited over and connected to the vias 171-174, respectively, and include a conductive material such as W, Co, Cu, Al, Mo, Ru, or a combination thereof. Optionally, a contact layer (e.g., TiN) may be deposited before the conductive material is deposited to create the conductor layers 175.

Further, vias 176 are formed over the conductor layers 175. For example, a dielectric material may be deposited to cover the conductor layers 175 and make the dielectric layer 119 thicker. After openings for vias 176 are formed, a thin layer of TiN may be deposited in some cases. The openings are then filled with a conductive material to form the vias 176. The conductive material of the vias 176 may include W, Co, Cu, Al, Mo, or Ru.

Further, a CVD or PVD process is performed to deposit a dielectric material (e.g., silicon oxide) to cover the vias 176 and thicken the dielectric layer 119 further. Openings are made and then filled to form connecting pads 177, 178, and 179 that serve as interconnects with a periphery device. As shown in FIG. 33, the connecting pads 177-179 are deposited over and electrically contact the vias 176, respectively. The connecting pads 177-179 may include a conductive material such as W, Co, Cu, Al, or a combination thereof. Optionally, a contact layer of a conductive material (e.g., TiN) may be deposited first before filling the openings to form the connecting pads 177-179.

Figure 34:
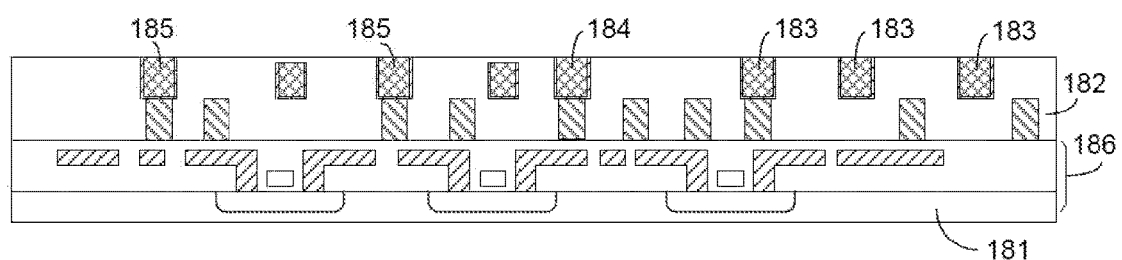
FIG. 34 illustrates a cross-sectional view of an exemplary periphery device according to various aspects of the present disclosure.

FIG. 34 shows a schematic cross-sectional view of a periphery device 180 according to aspects of the present disclosure. The periphery device 180 is a part of a 3D memory device and may also be referred to as a peripheral structure. The periphery device 180 includes a substrate 181 that may include single crystalline silicon, Ge, SiGe, SiC, SOI, GOI, polysilicon, or a Group III-V compound such as GaAs or InP. Periphery CMOS circuits 186 (e.g., control circuits) are fabricated on the substrate 181 and used for facilitating the operation of the 3D memory device. For example, the periphery CMOS circuits 186 may include metal-oxide-semiconductor field-effect transistors (MOS-FETs) and provide functional devices such as page buffers, sense amplifiers, column decoders, and row decoders. A dielectric layer 182 is deposited over the substrate 181 and the CMOS circuits 186. Connecting pads (such as connecting pads 183-185) and vias for interconnect are formed in the dielectric layer 182. The dielectric layer 182 includes one or more dielectric materials such as silicon oxide and silicon nitride. The connecting pads 183-185 are formed to connect with the 3D array device 100 and may include a conductive material such as W, Co, Cu, Al, Ti or a combination thereof.

For the 3D array device 100 and periphery device 180, the bottom side of the substrate 110 or 181 may be referred to as the back side, and the side with the connecting pads 177-179 or 183-185 may be referred to as the front side or face side.

Figure 35:
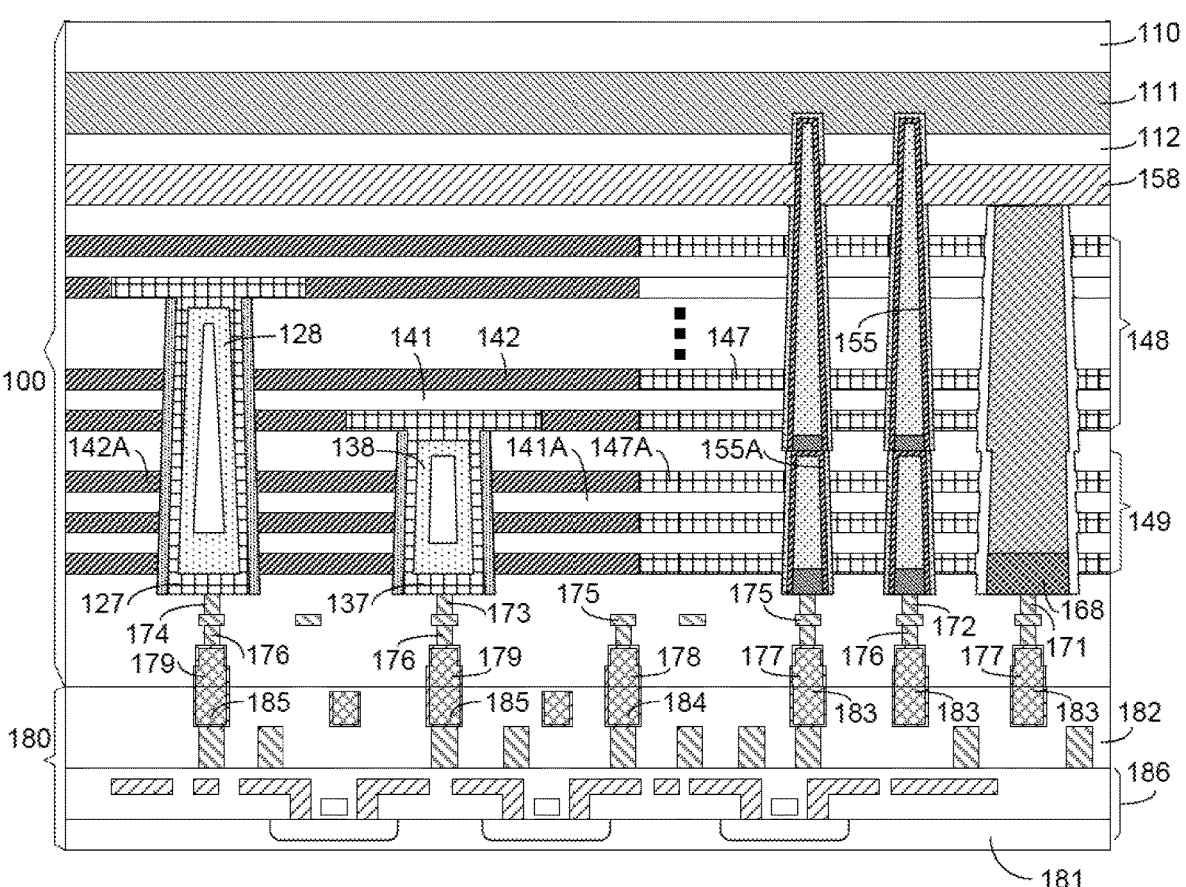
FIG. 35 illustrates a cross-sectional view of a 3D memory device after the 3D array device shown in FIG. 33 is bonded with the periphery device shown in FIG. 34 according to various aspects of the present disclosure.

FIG. 35 schematically shows a fabrication process of an exemplary 3D memory device 190 in a cross-sectional view according to aspects of the present disclosure. The 3D memory device 190 includes the 3D array device 100 shown in FIG. 33 and the periphery device 180 shown in FIG. 34.

The 3D array device 100 and periphery device 180 are bonded by a flip-chip bonding method to form the 3D memory device 190, as shown in FIG. 35. In some aspects, the 3D array device 100 is flipped vertically and becomes upside down with the top surfaces of the connecting pads 177-179 facing downward. The two devices are placed together such that the 3D array device 100 is above the periphery device 180. After an alignment is made, e.g., the connecting pads 177-179 are aligned with the connecting pads 183-185, respectively, the 3D array device 100 and periphery device 180 are joined face to face and bonded together. The conductor/insulator stacks 148-149 and the periphery CMOS circuits become sandwiched between the substrates 110 and 181 or between the layer 111 and the substrate 181. In some aspects, a solder or a conductive adhesive is used to bond the connecting pads 177-179 with the connecting pads 183-185, respectively. As such, the connecting pads 177-179 are connected to the connecting pads 183-185, respectively. The 3D array device 100 and periphery device 180 are in electrical communication after the flip-chip bonding process is completed.

Thereafter, other fabrication steps or processes are performed to complete fabrication of the 3D memory device 190. The other fabrication steps and processes are not reflected in FIG. 35 for simplicity. For example, from the bottom surface (after the flip-chip bonding), part of the substrate 110 may be removed by a thinning process, such as wafer grinding, dry etch, wet etch, CMP, or a combination thereof. Further, a passivation layer is deposited, contact pads are formed, and additional fabrication steps or processes are performed. Details of the additional fabrication steps or processes are omitted for simplicity.

FIG. 36 shows a schematic flow chart 200 for fabricating a 3D memory device according to aspects of the present disclosure. At 210, a substrate is provided for fabricating a 3D array device. In some aspects, a first polysilicon layer, a silicon oxide layer, and a second polysilicon layer as a sacrificial layer are deposited over the substrate sequentially. A portion of the sacrificial layer is removed to create an opening by a selective etch. The opening is subsequently filled by a carbon material to form a carbon block that is embedded in the sacrificial layer. Further, a first dielectric stack of the 3D array device is fabricated over the sacrificial layer and carbon block. The first dielectric stack includes a first stack layer and a second stack layer that are alternately stacked. The first stack layer includes a first dielectric layer and the second stack layer includes a second dielectric layer that is different than the first dielectric layer. In some aspects, one of the first and second dielectric layers is used as a sacrificial stack layer. Assuming that the first dielectric layer is silicon oxide, while the second dielectric layer is silicon nitride and used as the sacrificial stack layer.

At 211, openings for channel holes (i.e., channel holes) and an opening for GLS are formed that extend through the first dielectric stack. The opening for GLS is aligned to the carbon block along a direction approximately perpendicular to the substrate. The openings are etched by a selective etch at the same time. The etch rate of silicon oxide and silicon nitride is much faster than the etch rate of the carbon block. As such, the channel holes pass through the first dielectric stack and the sacrificial layer, and penetrate the first polysilicon layer partially, while the opening for GLS passes through the first dielectric stack, penetrates the carbon block partially, and does not reach the first polysilicon layer. The channel hole is deeper than the opening for GLS. The carbon block is exposed at the bottom of the opening for GLS.

At 212, the channel holes are filled with a carbon material, and the opening for GLS is filling with NDC, respectively. The carbon material in the channel holes is removed in a selective etch, and first channel hole structures are formed in the channel holes. For example, a first functional layer is deposited on the sidewall and bottom surface of the channel hole. The first functional layer includes a blocking layer, a charge trap layer, and a tunneling layer that are deposited sequentially. Thereafter, a first semiconductor channel is grown on a surface of the tunneling layer. The first channel hole structure includes the first functional layer and first semiconductor channel.

At 213, the filling material in the opening for GLS is removed in a selective etch, and NDC is deposited to grow a spacer layer on the sidewall of the opening for GLS. The NDC spacer layer is configured to protect the first and second dielectric layers. The carbon block is removed in another selective etch to expose the sacrificial layer at the bottom of the opening. The exposed sacrificial layer is etched in an additional selective etch, creating a cavity.

The cavity exposes a portion of the blocking layer of the first functional layer in the cavity. Then, the layers of the first functional layer exposed sequentially in the cavity, including the blocking layer, the charge trap layer, and the tunnel insulation layer, are etched away by, e.g., one or more selective etch processes, respectively. As a result, a portion of the first functional layer that is close to the substrate is removed and the side portion of the first semiconductor channel is exposed in the cavity. The cavity is filled with polysilicon to form a semiconductor layer. The semiconductor layer is connected with the first semiconductor channel electrically. Thereafter, the opening for GLS is filled again with a carbon material, forming a carbon filling structure.

At 214, a second dielectric stack of the 3D array device is deposited over the first dielectric stack, the first channel hole structure, and the carbon filling structure. The second dielectric stack includes a third stack layer and a fourth stack layer that are alternately stacked. The third stack layer includes a third dielectric layer and the fourth stack layer includes a fourth dielectric layer that is different than the third dielectric layer. In some aspects, one of the third and fourth dielectric layers is used as a sacrificial stack layer. Exemplarily, the third dielectric layer is silicon oxide, while the fourth dielectric layer is silicon nitride and used as the sacrificial stack layer.

At 215, openings for channel holes (i.e., channel holes) and an opening for GLS are formed at the same time by the same etch process. The openings extend through the second dielectric stack. The channel holes are aligned to the first channel hole structures, respectively. The opening for GLS is aligned to the carbon filling structure. The alignment is made along a direction approximately perpendicular to the substrate. At the bottom of the openings, the first channel hole structures and the carbon filling structure are exposed.

At 216, the channel holes are filled with polysilicon, and the opening for GLS is filled with NDC. Polysilicon in the channel holes is removed in a selective etch, exposing the conductive plug of the first channel hole structure. Part of the conductive plug may be etched out when the conductive plug contains polysilicon. Further, second channel hole structures are formed in the channel holes. For example, a second functional layer is deposited on the sidewall and bottom surface of the channel hole. The second functional layer includes a blocking layer, a charge trap layer, and a tunneling layer that are deposited sequentially. The second functional layer on the bottom surface of the channel hole is etched away. Thereafter, a second semiconductor channel is grown on a surface of the tunneling layer and the conductive plug of the first channel hole structure. The second channel hole structure includes the second functional layer and second semiconductor channel. The second semiconductor channel electrically contacts the conductive plug of the first channel hole structure. The first and second channel hole structures are electrically connected, since the first and second semiconductor channels are electrically connected.

In some cases, a third dielectric stack may be deposited over the second dielectric stack and similar methods may be used to make the third channel hole structures and a filling structure in an opening for GLS. For simplicity, processes to make the third dielectric stack and third channel hole structures are omitted. Descriptions below illustrate the 3D array device with the first and second dielectric stacks.

At 217, an opening for SCT is formed by etch. The opening for SCT extends toward the substrate to reach and expose a target second dielectric layer or fourth dielectric layer. A dielectric material such as aluminum oxide is deposited to form a spacer layer on the sidewall of the opening for SCT. A selective etch is performed to create a cavity by removing a section of the target second or fourth dielectric layer. The opening and cavity are then filled with polysilicon in a deposition process. Further, additional openings and cavities may be made and then filled with polysilicon. The additional cavities each expose a respective second dielectric layer or fourth dielectric layer. In some embodiments, the openings for SCT may be formed and then filled between 214 and 215, i.e., after the second dielectric stack is made and before the openings for the second channel hole structure and GLS are etched. In these cases, the second channel hole structures may be fabricated after the openings for SCT are formed.

Further, NDC filled in the opening for GLS and the carbon filling structure are removed in selective etches, forming a GLS opening that reaches and exposes the semiconductor layer at the bottom. The first to fourth dielectric layers are also exposed on the sidewall. The exposed second and fourth dielectric layers are etched out in a selective etch and cavities are formed. The cavities are filled with a conductive material to form conductive layers in a cavity filling process. The conductive layers are word lines. Optionally, the cavity filling process may include depositing a layer of a high-k dielectric material, a layer of TiN, and a metallic material (e.g., W) consecutively. The first and second dielectric stacks are transformed into the first and second conductor/insulator stacks.

Further, a dielectric layer such as an oxide layer is deposited on the sidewall and bottom surface of the opening for GLS. Part of the dielectric layer on the bottom surface is etched out selectively to expose the semiconductor layer. Electrically conductive materials, such as TiN, W, Cu, Al, and/or doped polysilicon is deposited in the opening for GLS to form an array common source that electrically contacts the semiconductor layer.

Further, polysilicon in the openings for SCT and cavities is removed in a selective etch, which exposes the dielectric spacer layers on the sidewalls and corresponding conductive layers in the cavities. A conductive material, such as W, Co, Cu, or Al, is deposited in the openings for SCT and cavities to form SCTs. The SCTs electrically contact the exposed conductive layers and thus are electrically connected with certain word lines, respectively. Optionally, a layer of TiN may be grown as a contact layer and/or barrier layer before depositing the conductive material to make the SCTs.

At 218, etching and deposition processes are performed to form other contacts including through silicon contacts that extend from the top surface towards the substrate. These contacts may be made of a conductive material such as W, Co, Cu, or Al. Further, silicon oxide is deposited to form a silicon oxide layer that covers the top surface. Openings are formed and filled in the silicon oxide layer to make vias. The vias may connect with the SCTs, the second channel hole structures, the through silicon contacts, etc. Thereafter, conductor layers, additional vias, and connecting pads are fabricated for the 3D array device.

Further, a flip-chip bonding process is performed to bond the 3D array device and a periphery device to create a 3D memory device. In some aspects, the 3D array device is flipped upside down and positioned above the periphery device. The connecting pads of the 3D array device and the periphery device are aligned and then bonded. Optionally, the substrate of the 3D array device is thinned. Etching and deposition processes are performed to form vias, conductor layers, and contact pads for the 3D memory device. The contact pads are configured for wire bonding for connection with other devices.

As illustrated above, the channel holes and opening for GLS are formed simultaneously by the same process. Compared to forming the channel holes and opening for GLS separately by two processes, the fabrication cost may be reduced in some cases. In addition, multiple dielectric stacks may be built by depositing a first dielectric stack, forming first channel hole structures, forming a first filling structure in a first GLS opening, depositing a second dielectric stack over the first dielectric stack, forming second channel hole structures, forming a second filling structure in a second GLS opening, and so on. As such, more layers for memory cells may be fabricated. The capacity of the 3D memory device may be increased. Further, certain risks of mechanical instability may be lowered to improve the yield and reliability.

Figure 37:
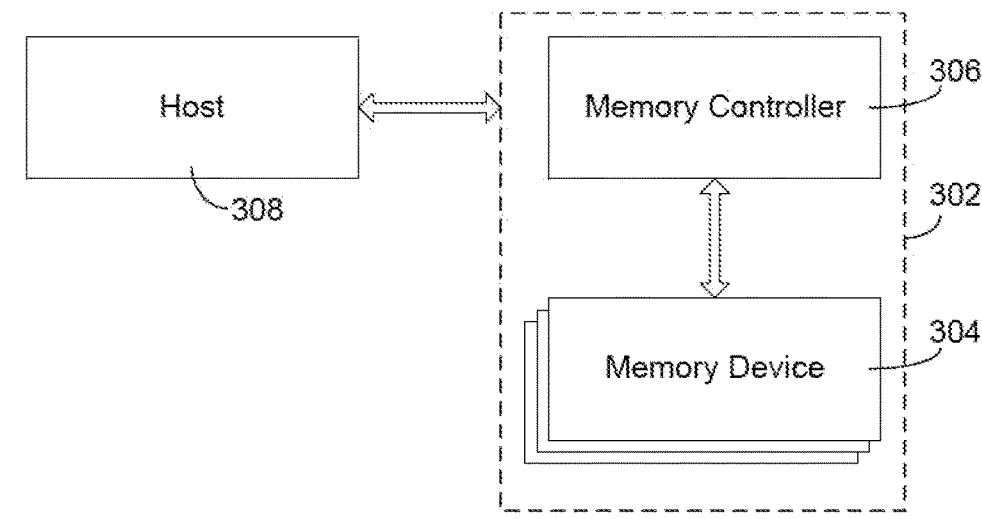
FIG. 37 illustrates a block diagram of an exemplary system having memory devices according to various embodiments of the present disclosure.

FIG. 37 shows a block diagram of an exemplary system 300 having a memory device according to various aspects of the present disclosure. The system 300 may be a mobile phone (e.g., a smartphone), a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 37, the system 300 may include a host 308 and a memory system 302 having one or more memory devices 304 and a memory controller 306. The host 308 may be a processor of an electronic device, such as a central processing unit (CPU), or a system-on-chip (SoC), such as an application processor (AP). The host 308 may be configured to send or receive data to or from the memory devices 304.

The memory controller 306 is coupled to the memory devices 304 and host 308 and is configured to control the memory devices 304, according to some implementations. The memory controller 306 may manage the data stored in the memory devices 304 and communicate with the host 308. In some embodiments, the memory controller 306 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some other embodiments, the memory controller 306 is designed for operating in a high duty-cycle environment, such as solid-state drives (SSDs) or embedded multi-media-cards (eMMCs) used as data storage for mobile devices, such as smartphones, tablets, laptop computers, etc., and enterprise storage arrays. The memory controller 306 may be configured to control operations of the memory device 304, such as read, erase, and program operations.

The memory controller 306 may also be configured to manage various functions with respect to the data stored or to be stored in the memory device 304 including, but not limited to bad-block management, garbage collection, logi-cal-to-physical address conversion, wear leveling, etc. In some implementations, the memory controller 306 is further configured to process error correction codes (ECCs) with respect to the data read from or written to the memory device 304. Any other suitable functions may be performed by the memory controller 306 as well, for example, formatting the memory device 304. The memory controller 306 may communicate with an external device (e.g., the host 308) according to a particular communication protocol. For example, the memory controller 306 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

The memory device 304 may be any memory device disclosed in the present disclosure, such as the 3D memory device 190 shown in FIG. 35. As the 3D memory device 190 may have lower fabrication costs and improved yield and reliability due to reasons described above, when the device 190 is used, the system 300 may have these merits, as well.

Figure 38:
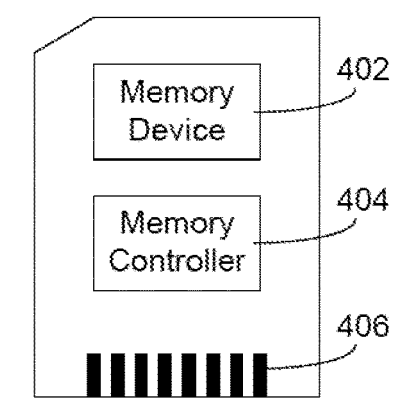
FIG. 38 illustrates a diagram of an exemplary memory card having a memory device, according to various aspects of the present disclosure.
Figure 39:
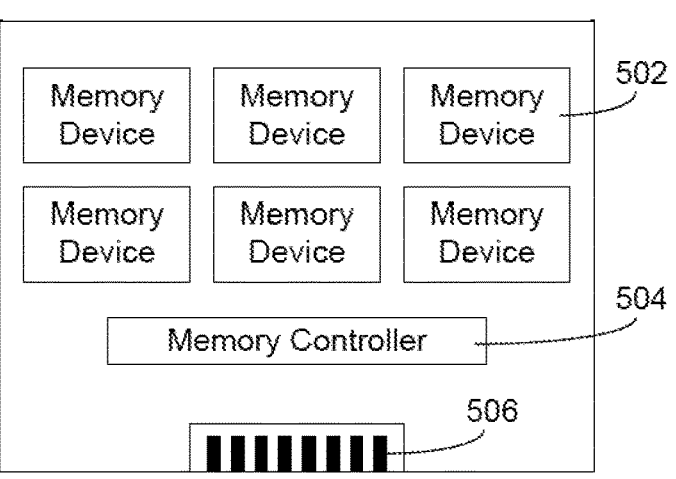
FIG. 39 illustrates a diagram of an exemplary solid-state drive (SSD) having memory devices, according to various aspects of the present disclosure.

The memory controller 306 and one or more memory devices 304 may be integrated into various types of storage devices, for example, be included in the same package, such as a universal Flash storage (UFS) package or an eMMC package. That is, the memory system 302 may be implemented and packaged into different types of end electronic products. FIGS. 38 and 39 exemplarily illustrate block diagrams of a memory card 400 and an SSD 500 according to various aspects of the present disclosure. As shown in FIG. 38, a memory controller 404 and a single memory device 402 may be integrated into the memory card 400. The memory device 402 may be any memory device illustrated above, such as the 3D memory device 190 shown in FIG. 35. The memory card 400 may include a PC card (personal computer memory card international association (PCM-CIA)), a CF card, a smart media (SM) card, a memory stick, a multimedia card (MMC, RS-MMC, or MMCmicro), an SD card (SD, miniSD, microSD, or SDHC), a UFS, etc. The memory card 400 may further include a memory card connector 406 configured to couple the memory card 400 to a host (e.g., the host 308 shown in FIG. 37). As shown in FIG. 39, a memory controller 504 and multiple memory devices 502 may be integrated into the SSD 500. The memory devices 502 may be any aforementioned memory device, such as the 3D memory device 190 shown in FIG. 35. The SSD 500 may further include an SSD connector 506 configured to couple the SSD 500 to a host (e.g., the host 308 shown in FIG. 37). In some embodiments, the storage capacity and/or the operation speed of the SSD 500 is greater than those of the memory card 400.

Although the principles and implementations of the present disclosure are described by using specific aspects in the specification, the foregoing descriptions of the aspects are only intended to help understand the present disclosure. In addition, features of aforementioned different aspects may be combined to form additional aspects. A person of ordinary skill in the art may make modifications to the specific implementations and application range according to the idea of the present disclosure. Hence, the content of the specification should not be construed as a limitation to the present disclosure.

What is claimed is:

1. A three-dimensional (3D) memory device, comprising:

a first conductor/insulator stack including a first conductive layer and a first dielectric layer alternatingly stacked;

a second conductor/insulator stack formed over and aligned with the first conductor/insulator stack and including a second conductive layer and a second dielectric layer alternatingly stacked;

a channel hole structure including:

a first semiconductor channel extending through the first conductor/insulator stack along a first direction, a first conductive plug formed on a sidewall surface of an upper portion of the first semiconductor channel, and a second semiconductor channel formed over the first conductive plug and through the second conductor/insulator stack; and a gate line slit (GLS) structure, the GLS structure including a first taper part through the first conductor/insulator stack and a second taper part through the second conductor/insulator stack along the first direction.

2. The 3D memory device according to claim 1, wherein the first taper part tapers from a first end with a first dimension to a second end with a second dimension along the first direction, the second taper part tapers from a third end with a third dimension to a fourth end with a fourth dimension along the first direction, the first end of the first taper part connects with the fourth end of the second taper part, and the first dimension is larger than the fourth dimension, the first, second, third, and fourth dimensions measured along a second direction that is perpendicular to the first direction.

3. The 3D memory device according to claim 1, wherein the first taper part tapers from a first end with a first dimension to a second end with a second dimension along the first direction, the second taper part tapers from a third end with a third dimension to a fourth end with a fourth dimension along the first direction, the first end of the first taper part connects with the fourth end of the second taper part, and the first dimension is smaller than the fourth dimension by a predetermined value, the first, second, third, and fourth dimensions measured along a second direction that is perpendicular to the first direction.

4. The 3D memory device according to claim 1, wherein the channel hole structure comprises:

a first functional layer through the first conductor/insulator stack and including a first blocking layer, a first charge trap layer, and/or a first tunneling layer, wherein the first semiconductor channel is formed over the first functional layer; and a second functional layer through the second conductor/insulator stack and over the first conductive plug, wherein the second semiconductor channel is formed over the second functional layer, the first and second semiconductor channels connected electrically.

5. The 3D memory device according to claim 4, further comprising:

a semiconductor layer, a portion of the semiconductor layer passing through the first functional layer and contacting the first semiconductor channel.

6. The 3D memory device according to claim 4, wherein the first conductive plug has a top surface coplanar with a top surface of the upper portion of the first semiconductor channel.

7. The 3D memory device according to claim 4, wherein the first conductive plug is in direct contact with the second functional layer.

8. The 3D memory device according to claim 7, wherein the fourth dielectric layer extends along the lateral direction to connect with each of the first and second dielectric layers.

9. The 3D memory device according to claim 7, wherein the SCT further includes a dielectric structure and a conductive structure surrounding the dielectric structure and the conductive structure is in contact with the third conductive layer, and/or the dielectric structure includes a dielectric layer enclosing an air gap there-in.

10. The 3D memory device according to claim 7, wherein an orthographic projection of the third conductive layer in each third dielectric layer in the dielectric stack on a plane along the lateral direction are non-overlapped.

11. The 3D memory device according to claim 7, wherein when one or more of the third and fourth dielectric layers are formed between one third conductive layer in the dielectric stack and a corresponding contact via, the SCT passes through the one or more of the third and fourth dielectric layers to connect to the corresponding contact via.

12. The 3D memory device according to claim 7, wherein one third conductive layer is formed in one third dielectric layer and corresponds to one of the first and second conductive layers.

13. The 3D memory device according to claim 1, further comprising:

a third conductor/insulator stack formed over and aligned with the second conductor/insulator stack and including a third conductive layer and a third dielectric layer alternatingly stacked, the channel hole structure extending through the first, second, and third conductor/insulator stacks, and the GLS structure further including a third taper part through the third conductor/insulator stack.

14. The 3D memory device according to claim 1, further comprising:

a third conductor/insulator stack formed over and aligned with the second conductor/insulator stack and including a third conductive layer and a third dielectric layer alternatingly stacked, the channel hole structure extending through the first, second, and third conductor/insulator stacks, and the second taper part extends through the second and third conductor/insulator stacks.

15. The 3D memory device according to claim 1, wherein the channel hole structure comprises a first dielectric layer formed on a sidewall surface of a lower portion of the first semiconductor channel and under the first conductive plug.

16. The 3D memory device according to claim 1, further comprising:

a dielectric stack including a third dielectric layer and a fourth dielectric layer alternatingly stacked, wherein the third dielectric layer extends along a lateral direction to connect with each of the first and second conductive layers;

a third conductive layer formed in and through the third dielectric layer in the dielectric stack; and a staircase contact (SCT) formed on the third conductive layer and extending along a vertical direction to connect to a contact via formed over the dielectric stack.

17. A system, comprising:

a memory device; and a memory controller for controlling the memory device, the memory device comprising:

a first conductor/insulator stack including a first conductive layer and a first dielectric layer alternatingly stacked;

a second conductor/insulator stack formed over and aligned with the first conductor/insulator stack and including a second conductive layer and a second dielectric layer alternatingly stacked;

a channel hole structure including:

a first semiconductor channel extending through the first conductor/insulator stack along a first direction, a first conductive plug formed on a sidewall surface of an upper portion of the first semiconductor channel, and a second semiconductor channel formed over the first conductive plug and through the second conductor/insulator stack; and a gate line slit (GLS) structure, the GLS structure including a first taper part through the first conductor/insulator stack and a second taper part through the second conductor/insulator stack along the first direction.

18. The system according to claim 17, wherein the first taper part tapers from a first end with a first dimension to a second end with a second dimension along the first direction, the second taper part tapers from a third end with a third dimension to a fourth end with a fourth dimension along the first direction, the first end of the first taper part connects with the fourth end of the second taper part, and the first dimension is larger than the fourth dimension, the first, second, third, and fourth dimensions measured along a second direction that is perpendicular to the first direction.

19. The system according to claim 17, wherein the first taper part tapers from a first end with a first dimension to a second end with a second dimension along the first direction, the second taper part tapers from a third end with a third dimension to a fourth end with a fourth dimension along the first direction, the first end of the first taper part connects with the fourth end of the second taper part, and the first dimension is smaller than the fourth dimension by a predetermined value, the first, second, third, and fourth dimensions measured along a second direction that is perpendicular to the first direction.

20. The system according to claim 17, wherein the memory device further comprises:

a third conductor/insulator stack formed over and aligned with the second conductor/insulator stack and including a third conductive layer and a third dielectric layer alternatingly stacked, the channel hole structure extending through the first, second, and third conductor/insulator stacks, and the GLS structure further including a third taper part through the third conductor/insulator stack.

* * * * *